(12) United States Patent
Wang et al.

(10) Patent No.: US 10,937,884 B1
(45) Date of Patent: Mar. 2, 2021

(54) GATE SPACER WITH AIR GAP FOR SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Sheng-Tsung Wang, Hsinchu (TW); Lin-Yu Huang, Hsinchu (TW); Chia-Lin Chuang, Taoyuan (TW); Chia-Hao Chang, Hsinchu (TW); Cheng-Chi Chuang, New Taipei (TW); Yu-Ming Lin, Hsinchu (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/571,715

(22) Filed: Sep. 16, 2019

(51) Int. Cl.
| | |
|---|---|
| *H01L 29/49* | (2006.01) |
| *H01L 29/45* | (2006.01) |
| *H01L 29/78* | (2006.01) |
| *H01L 29/66* | (2006.01) |
| *H01L 21/764* | (2006.01) |
| *H01L 21/28* | (2006.01) |

(52) U.S. Cl.
CPC .... *H01L 29/4991* (2013.01); *H01L 21/28123* (2013.01); *H01L 21/764* (2013.01); *H01L 29/45* (2013.01); *H01L 29/6656* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

*Primary Examiner* — Thien F Tran
(74) *Attorney, Agent, or Firm* — McClure, Qualey & Rodack, LLP

(57) ABSTRACT

A semiconductor device structure includes a gate stack and an adjacent source/drain contact structure formed over a semiconductor substrate. The semiconductor device structure includes a first gate spacer structure extending from a sidewall of the gate stack to a sidewall of the source/drain contact structure, and a second gate spacer structure formed over the first gate spacer structure and between the gate stack and the source/drain contact structure. The second gate spacer structure includes first and second gate spacer layers adjacent to the sidewall of the gate stack and the sidewall of the source/drain contact structure, respectively, and a third gate spacer layer separating the first gate spacer layer from the second gate spacer layer, so that an air gap is sealed by the first, second, and the third gate spacer layers and the first gate spacer structure.

20 Claims, 20 Drawing Sheets

(56) References Cited

U.S. PATENT DOCUMENTS

| | | |
|---|---|---|
| 9,576,814 B2 | 2/2017 | Wu et al. |
| 2019/0067442 A1* | 2/2019 | Lin ..................... H01L 29/4991 |
| 2019/0172752 A1* | 6/2019 | Hsu ................ H01L 21/823475 |
| 2019/0312123 A1* | 10/2019 | Cheng ................ H01L 29/4966 |

* cited by examiner

GATE SPACER WITH AIR GAP FOR SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, as the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET).

Although existing FinFETs and the manufacturing processes thereof have generally been adequate for their intended purposes, they have not been entirely satisfactory in all respects, especially as device scaling-down continues. For example, it is a challenge to form gate spacer structures at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
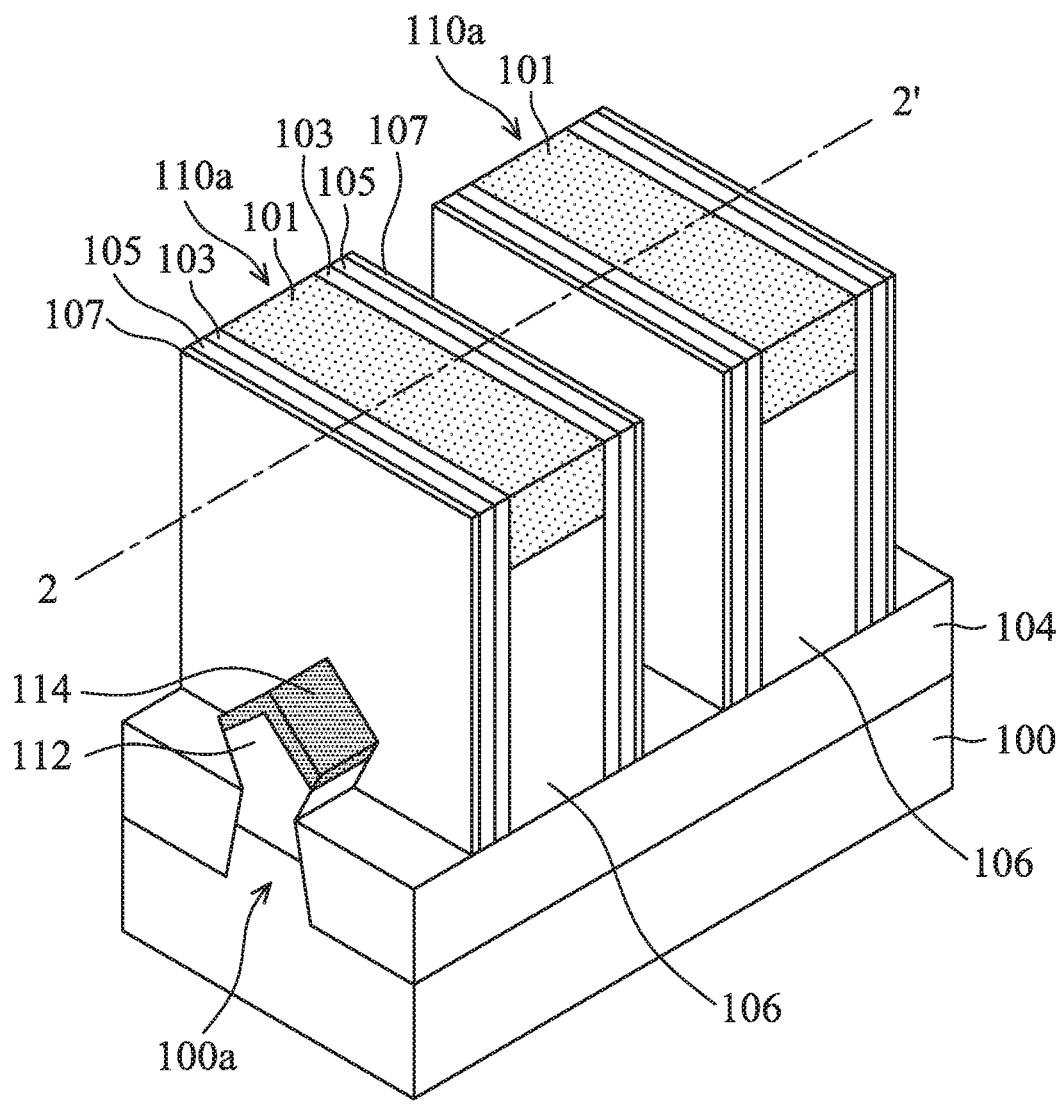
FIGS. 1A to 1F illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for semiconductor device structures and the fabrication thereof are provided. The semiconductor device structures may include an active gate stack and an adjacent conductive contact structure (which is also referred to as a source/drain contact structure) over a fin structure of the semiconductor substrate. A first gate spacer structure and a second gate spacer structure over the first gate spacer structure are successively formed between the active gate stack and the conductive contact structure. During the formation of the second gate spacer structure, a first gate spacer layer is formed adjacent to the sidewall of the active gate stack, a second gate spacer layer is formed adjacent to the sidewall of the conductive contact structure, and a third gate spacer layer is formed to separate an upper portion of the first gate spacer layer from an upper portion of the second gate spacer layer, so as to define an air gap that separates a lower portion of the first gate spacer layer from a lower portion of the second gate spacer layer. The existence of the air gap reduces the dielectric constant (k) of the second gate spacer structure, thereby reducing the parasitic capacitance between the source/drain contact structure and the gate electrode layer of the active gate stack. Moreover, the second gate spacer structure can be formed with a material that is different form a material of the first gate spacer structure, so that the total dielectric constant (k) of the first and second gate spacer structures can be lowered further. As a result, the device performance can be effectively increased.

Figure 1B:
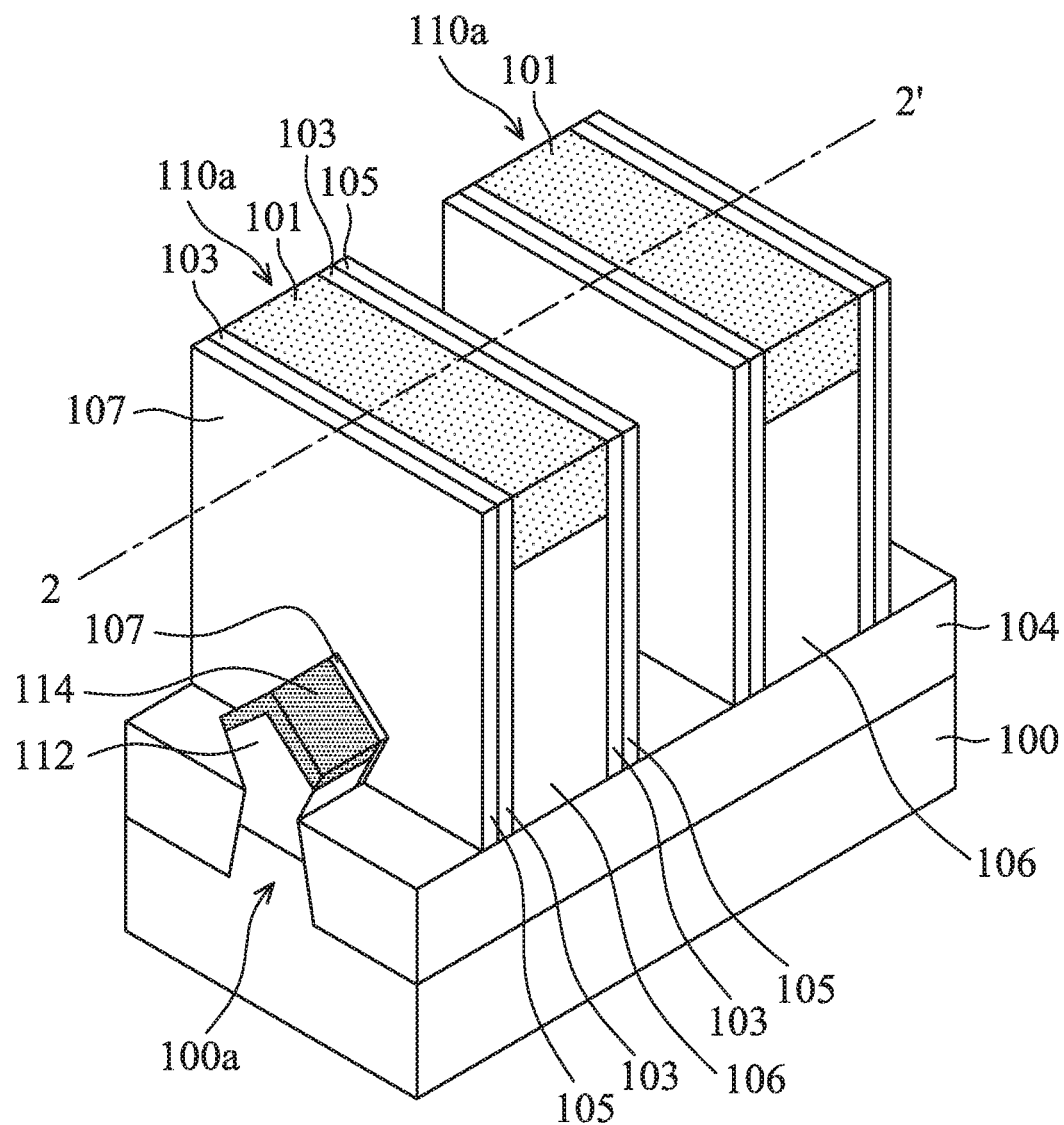
Figure 1C:
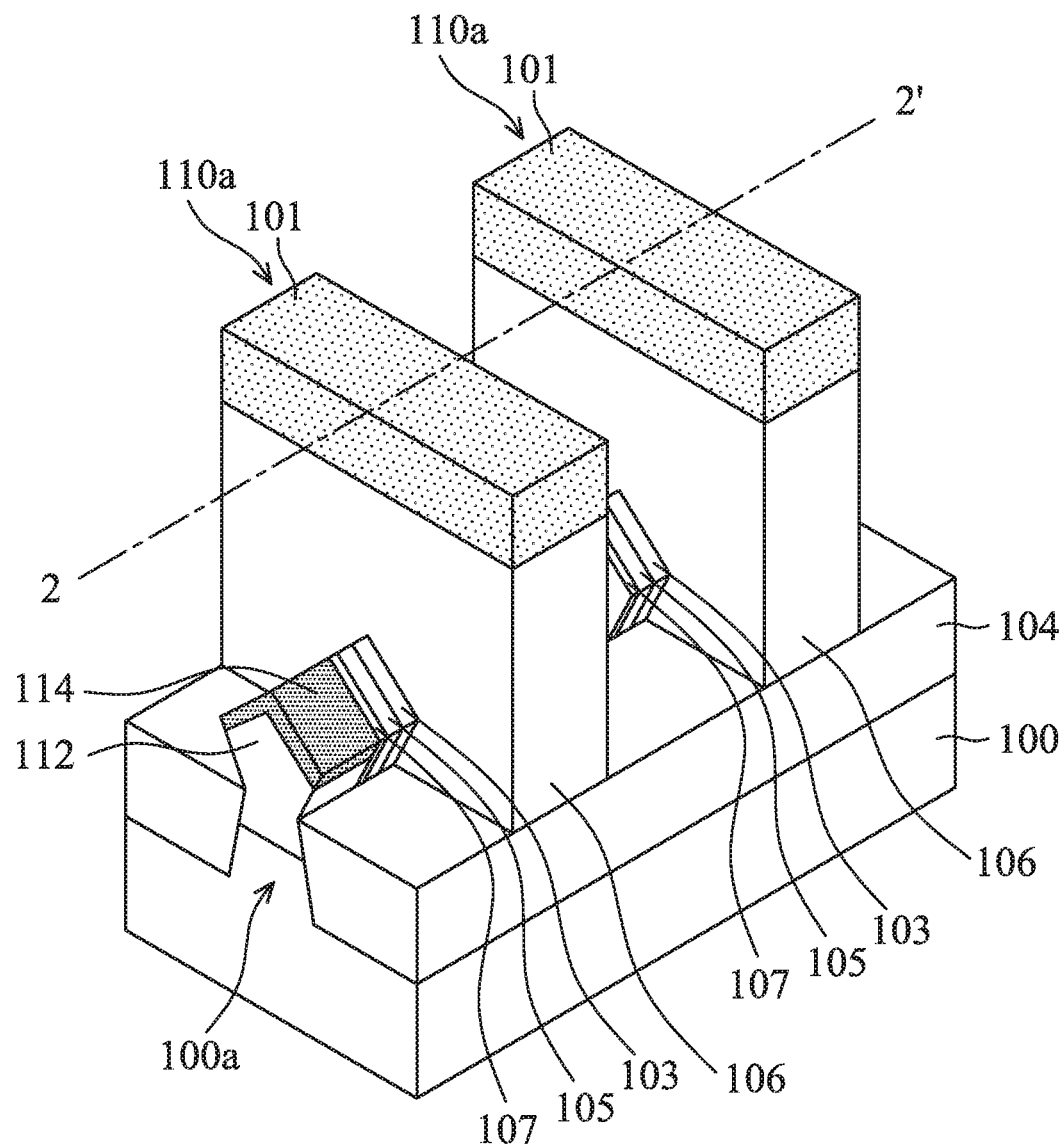
Figure 1D:
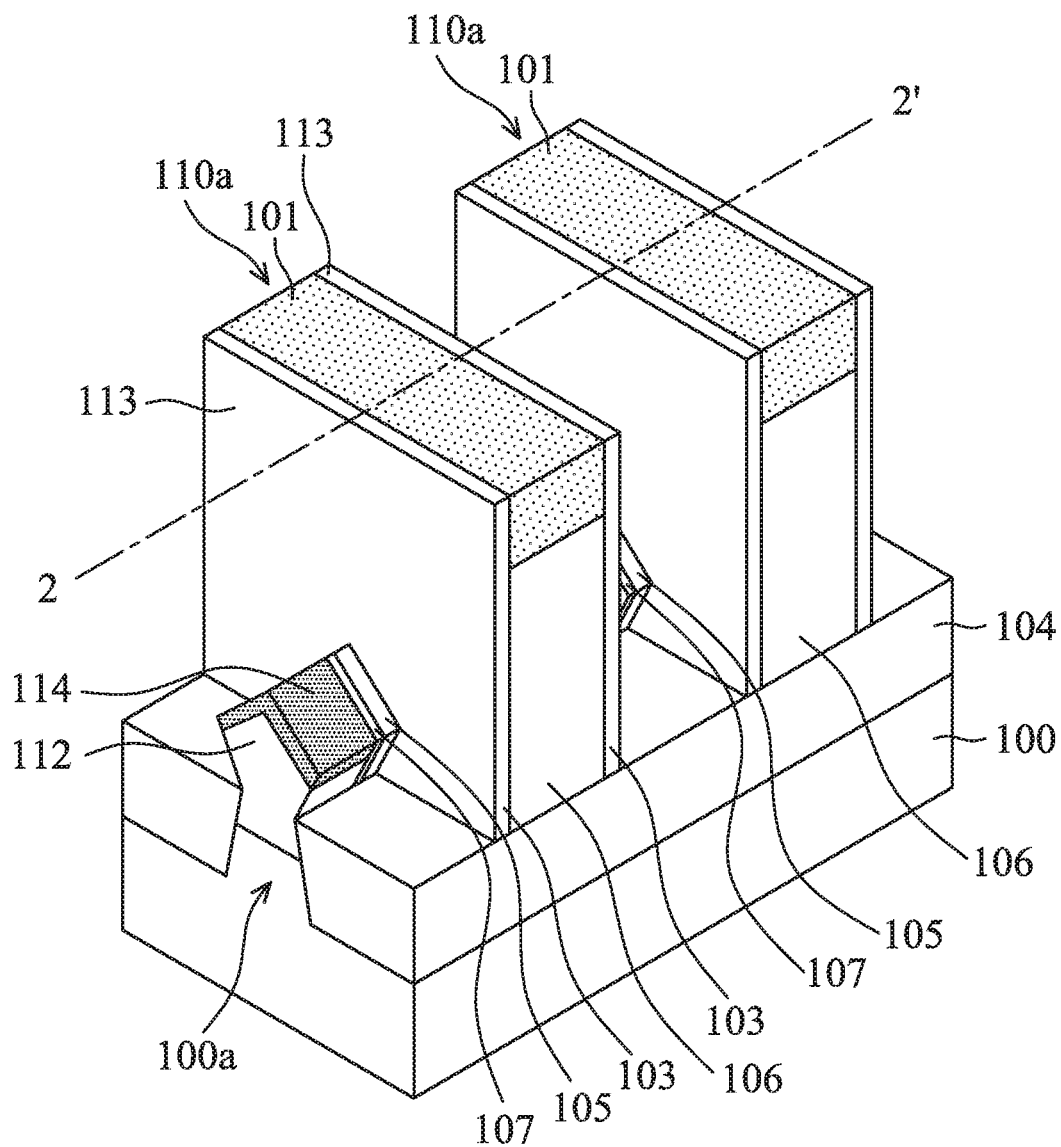
Figure 1E:
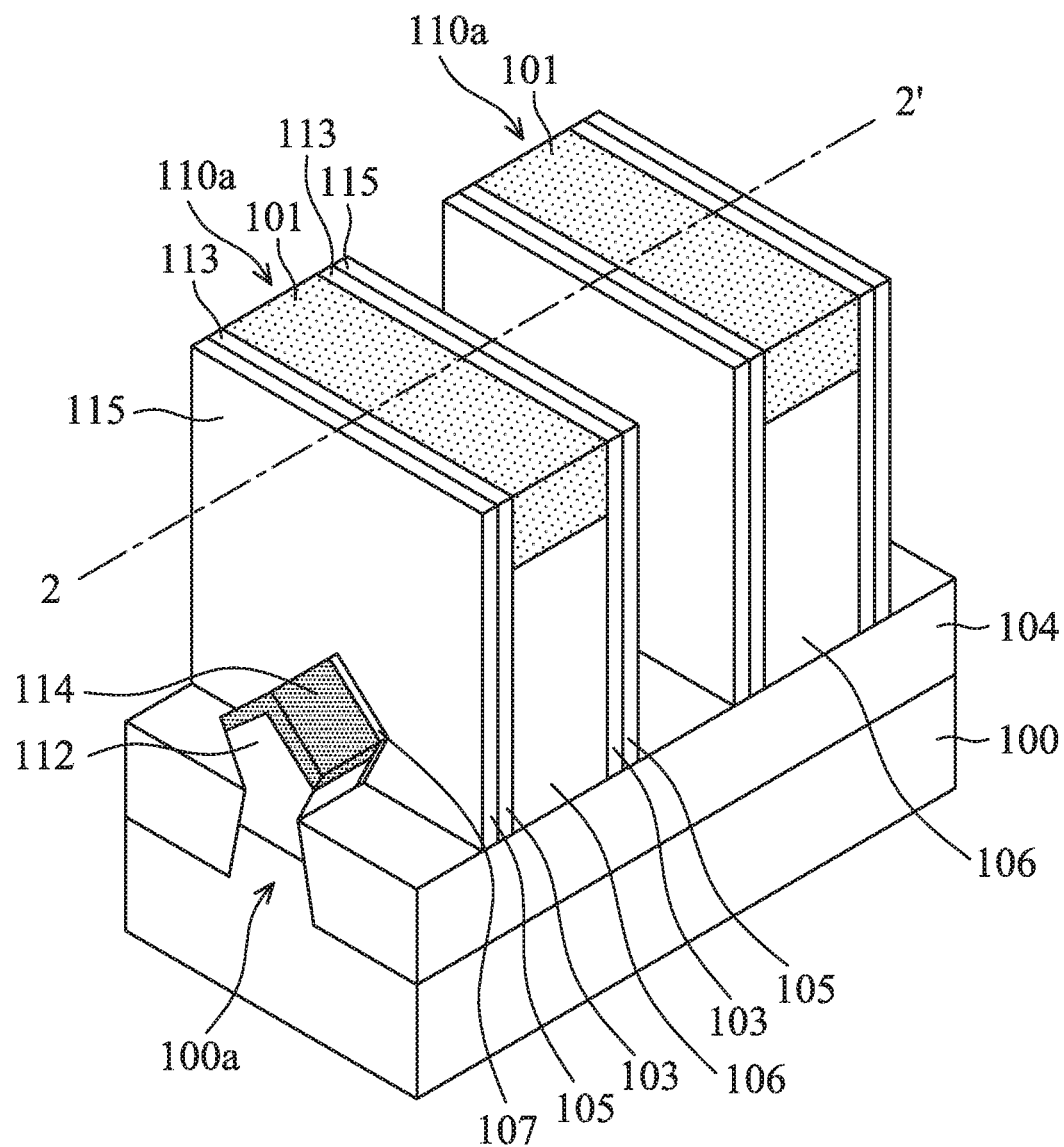
Figure 1F:
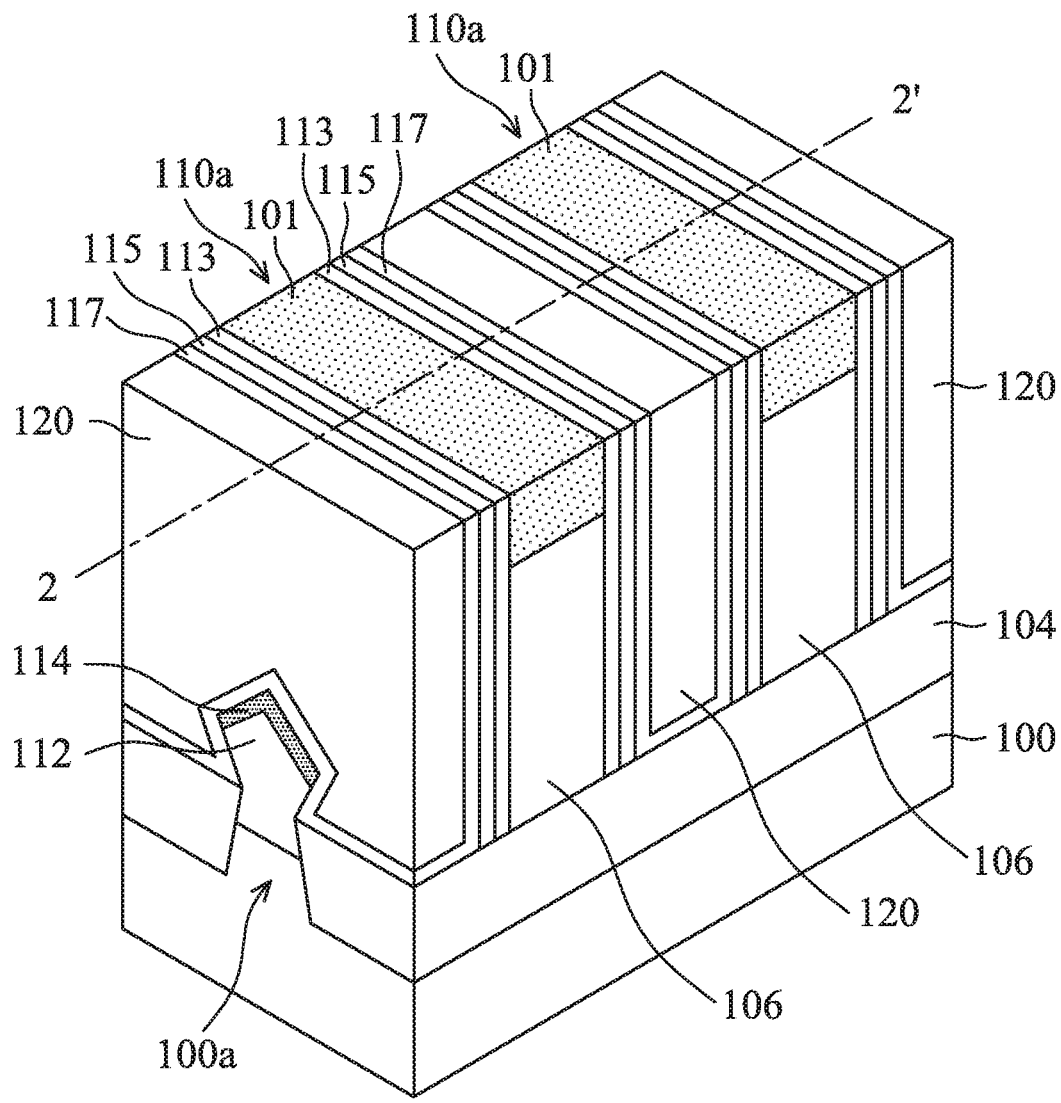
Figure 2A:
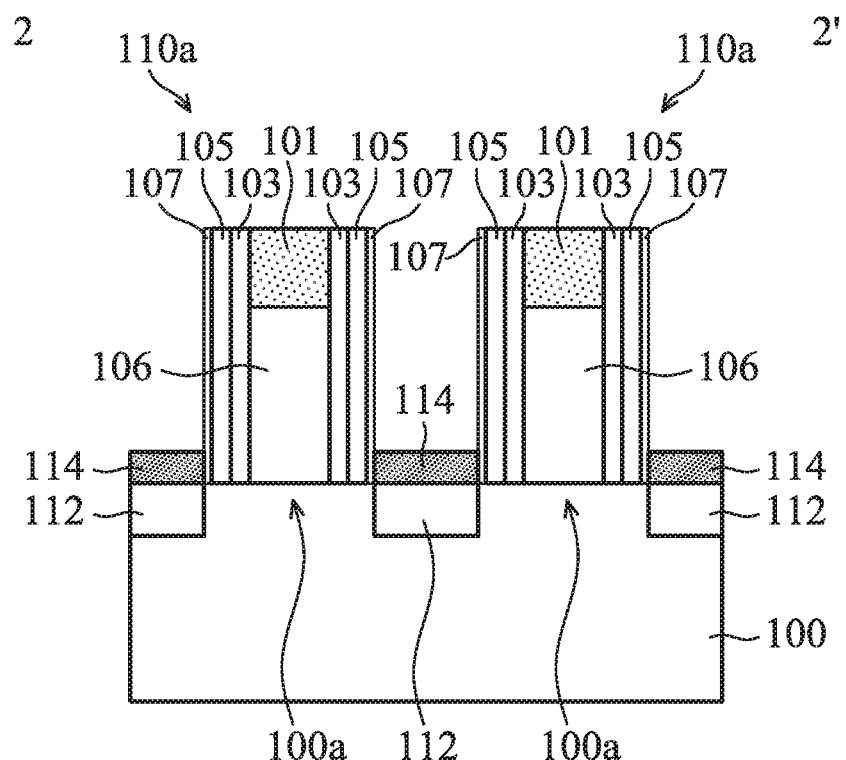
FIGS. 2A to 2P illustrate cross-sectional representations of various stages of manufacturing the semiconductor device structure in accordance with some embodiments.
Figure 2B:
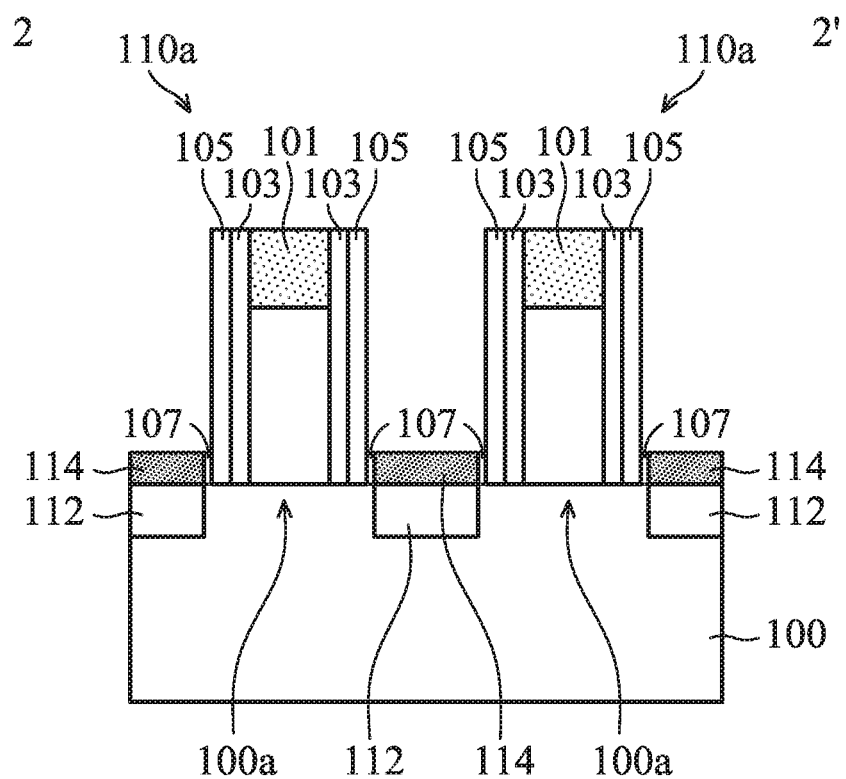
Figure 2C:
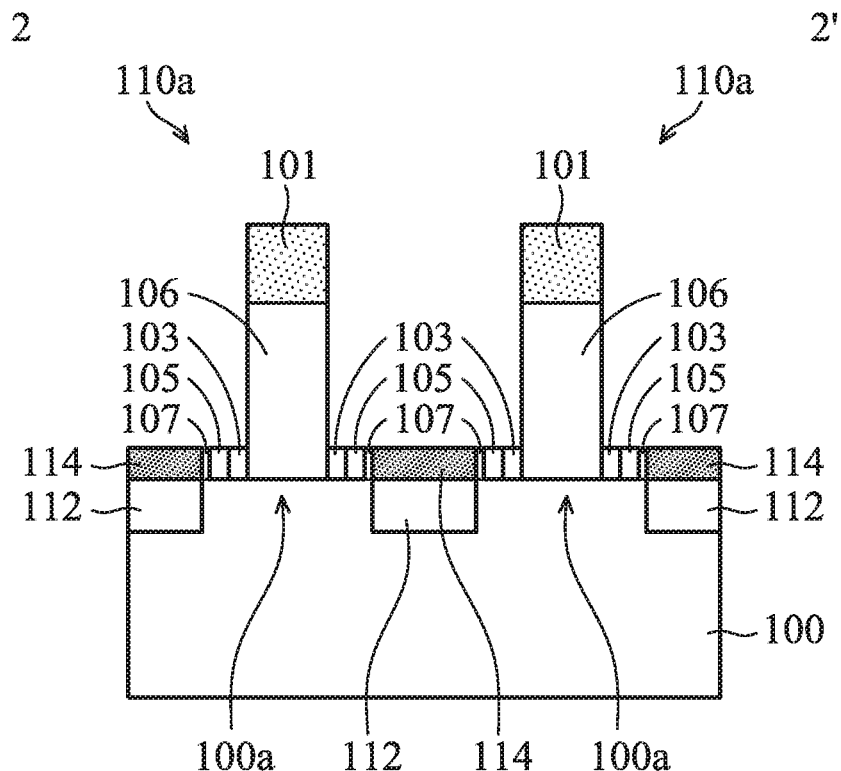
Figure 2D:
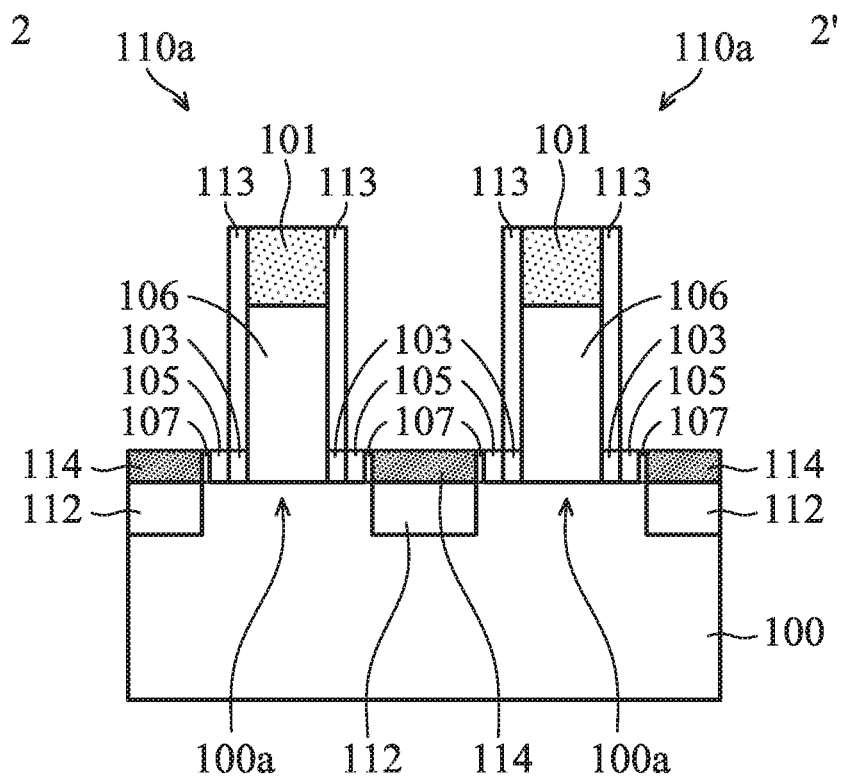
Figure 2E:
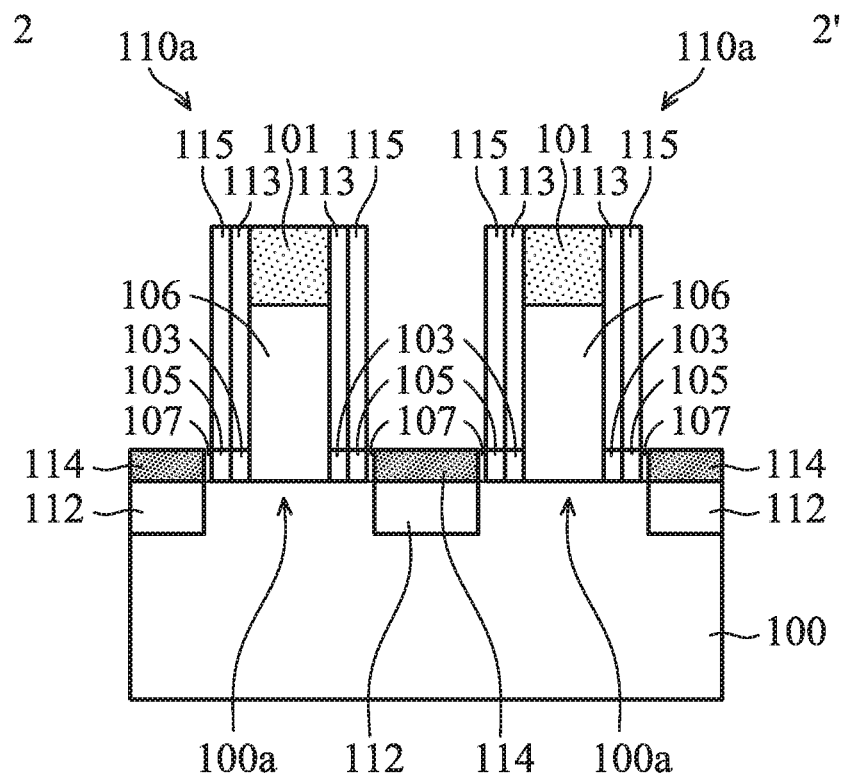
Figure 2F:
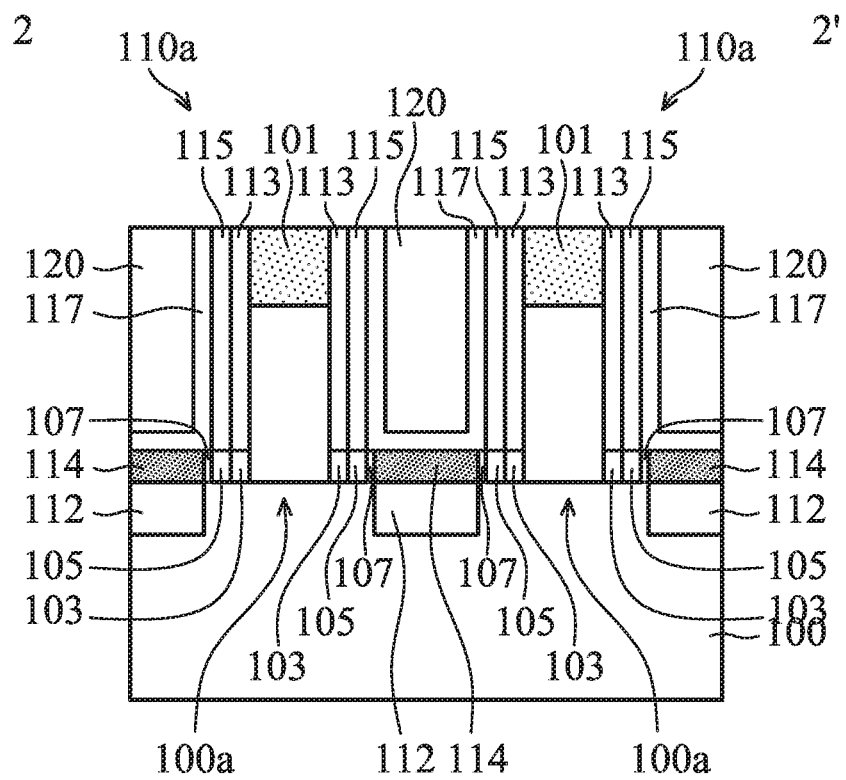
Figure 2G:
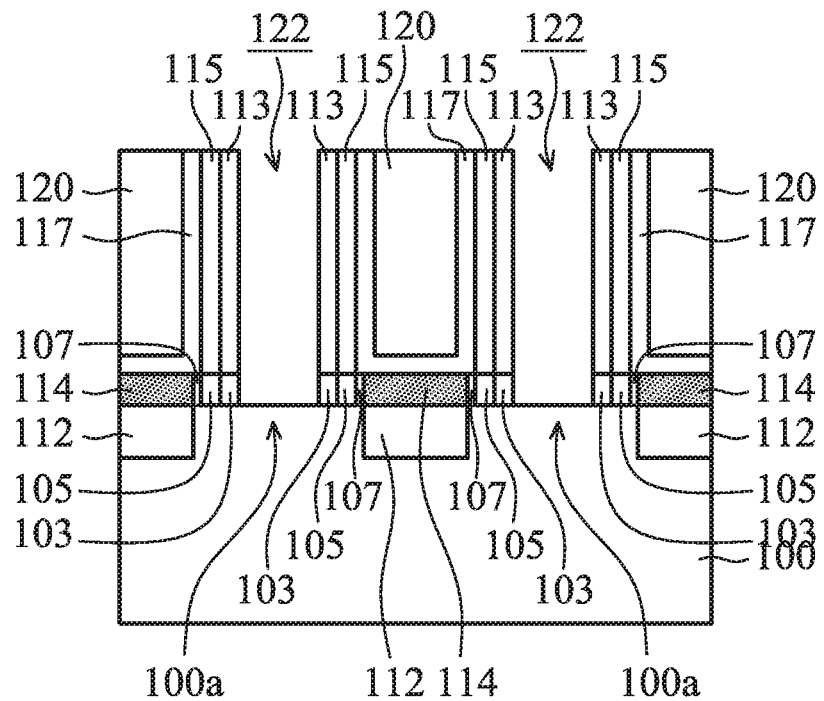
Figure 2H:
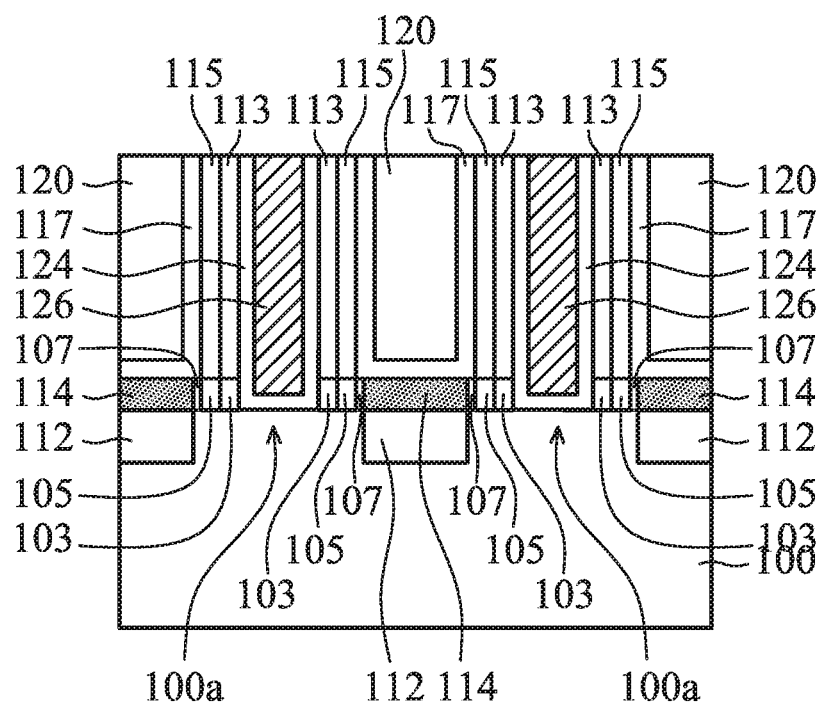
Figure 2I:
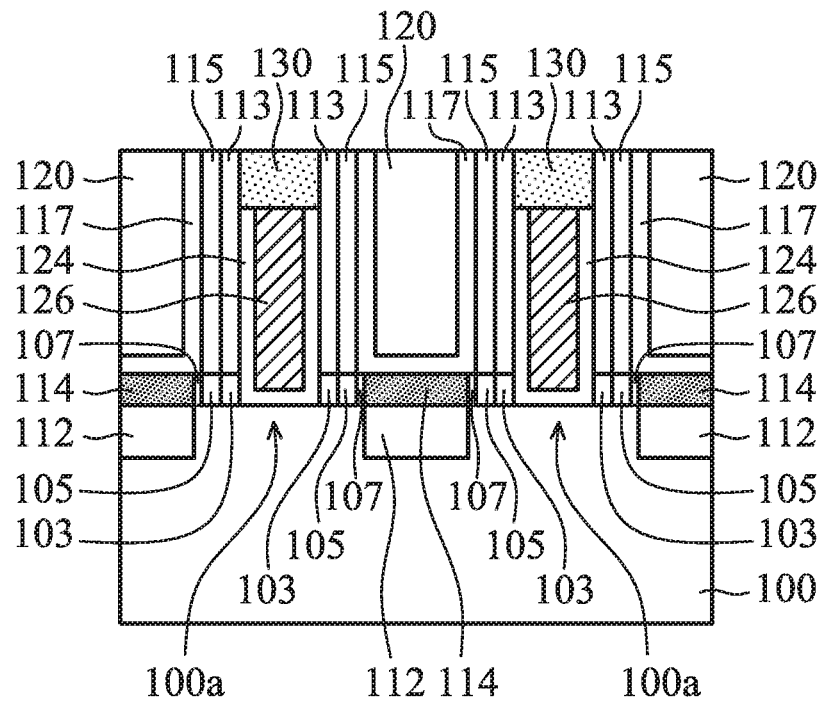
Figure 2J:
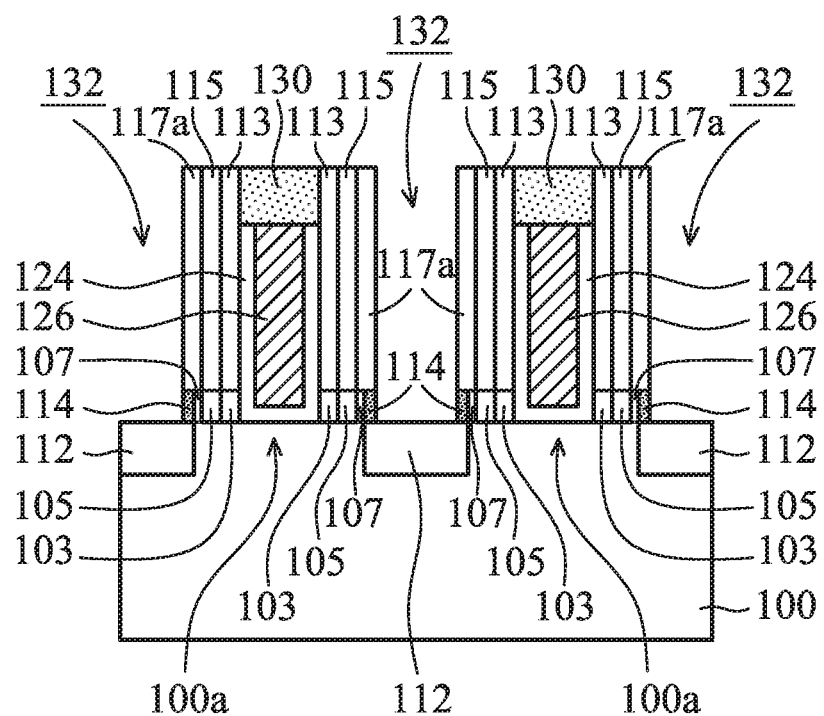
Figure 2K:
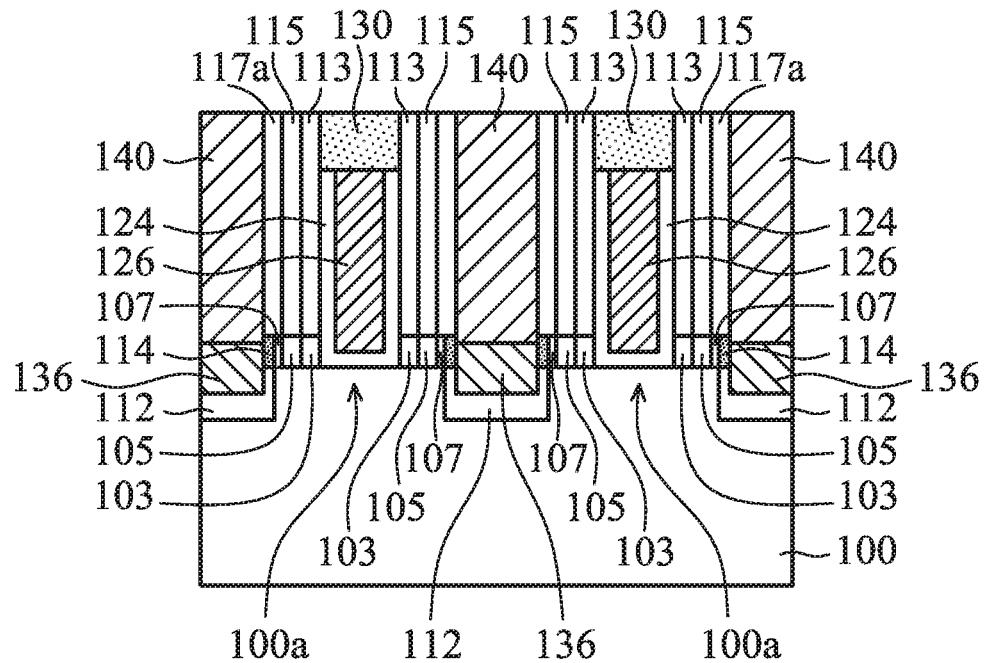
Figure 2L:
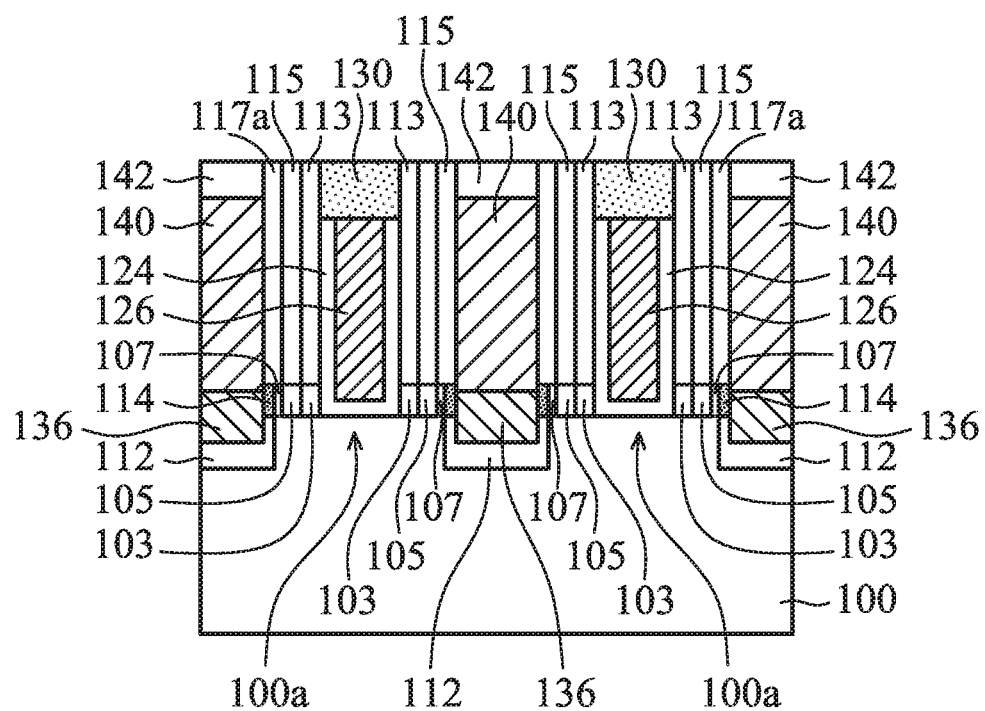
Figure 2M:
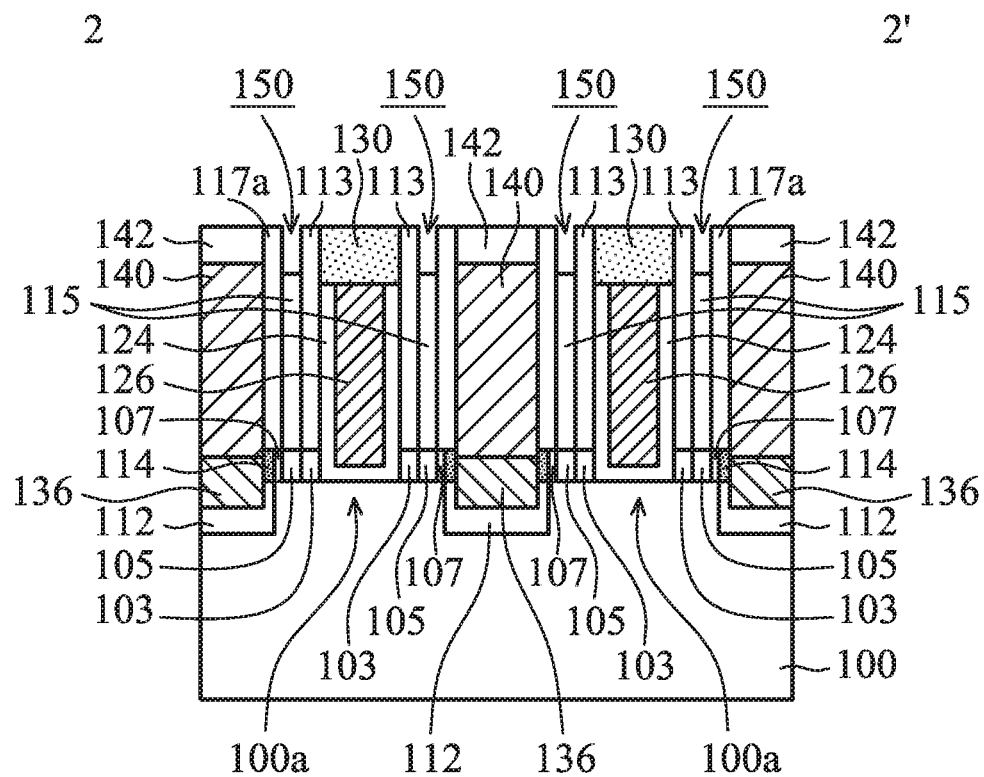
Figure 2N:
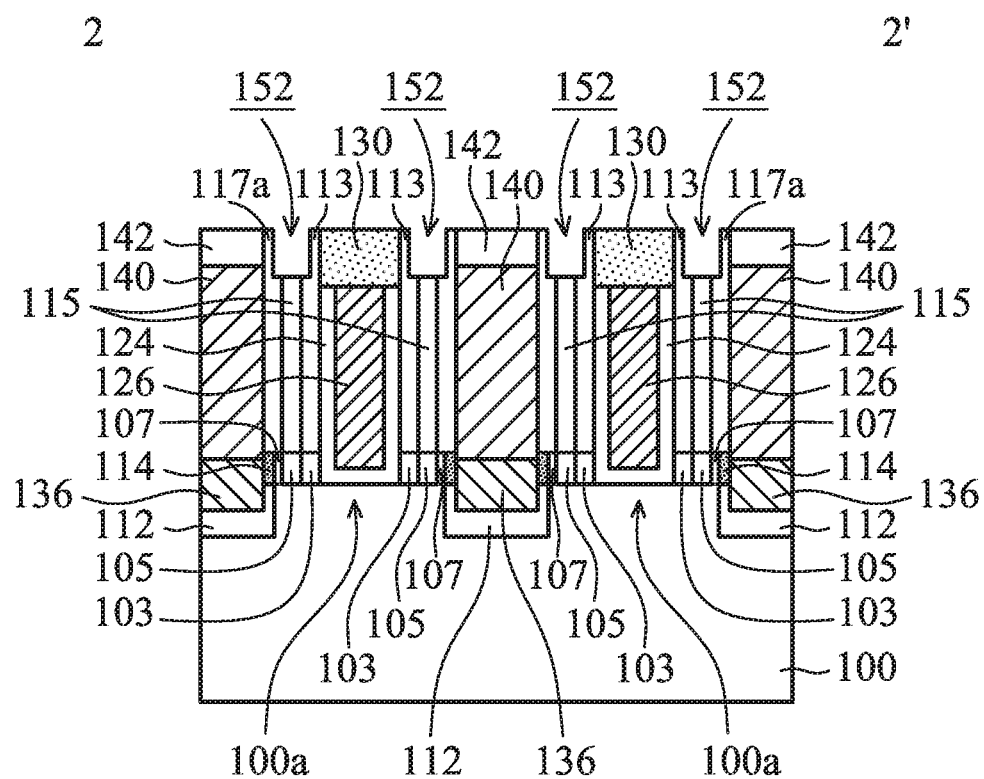
Figure 2O:
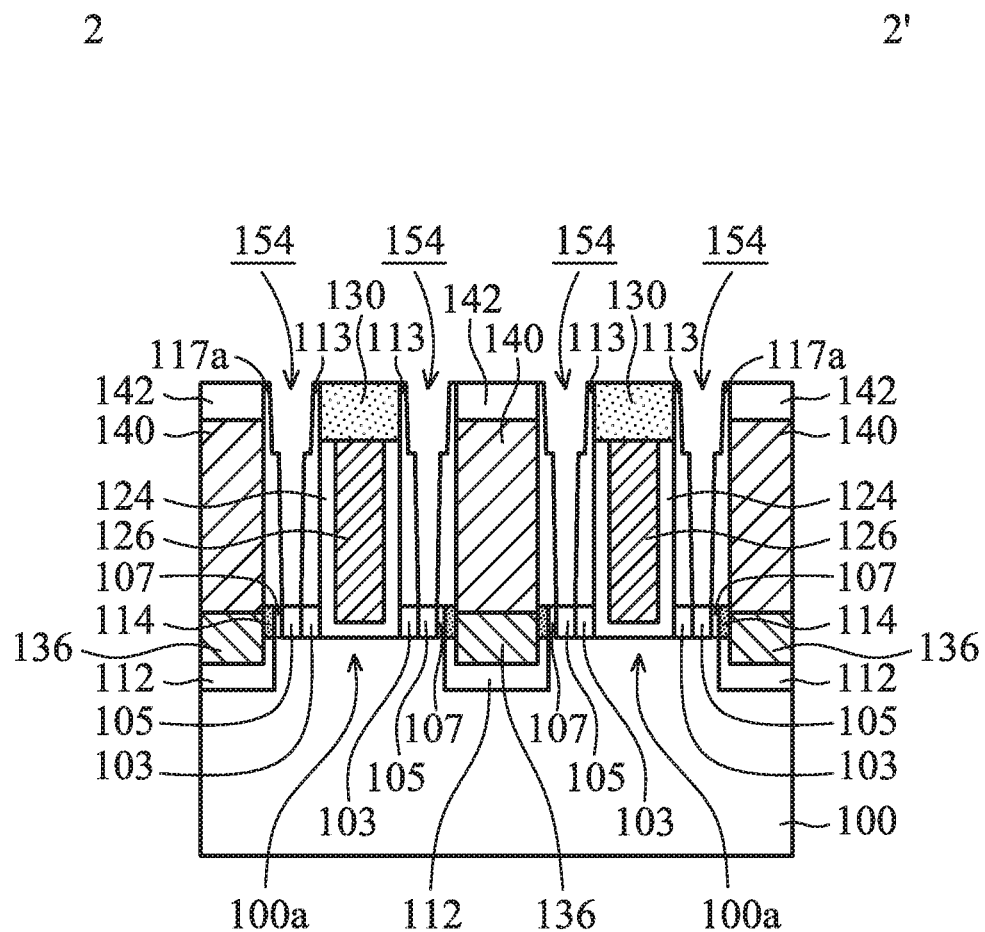
Figure 2P:
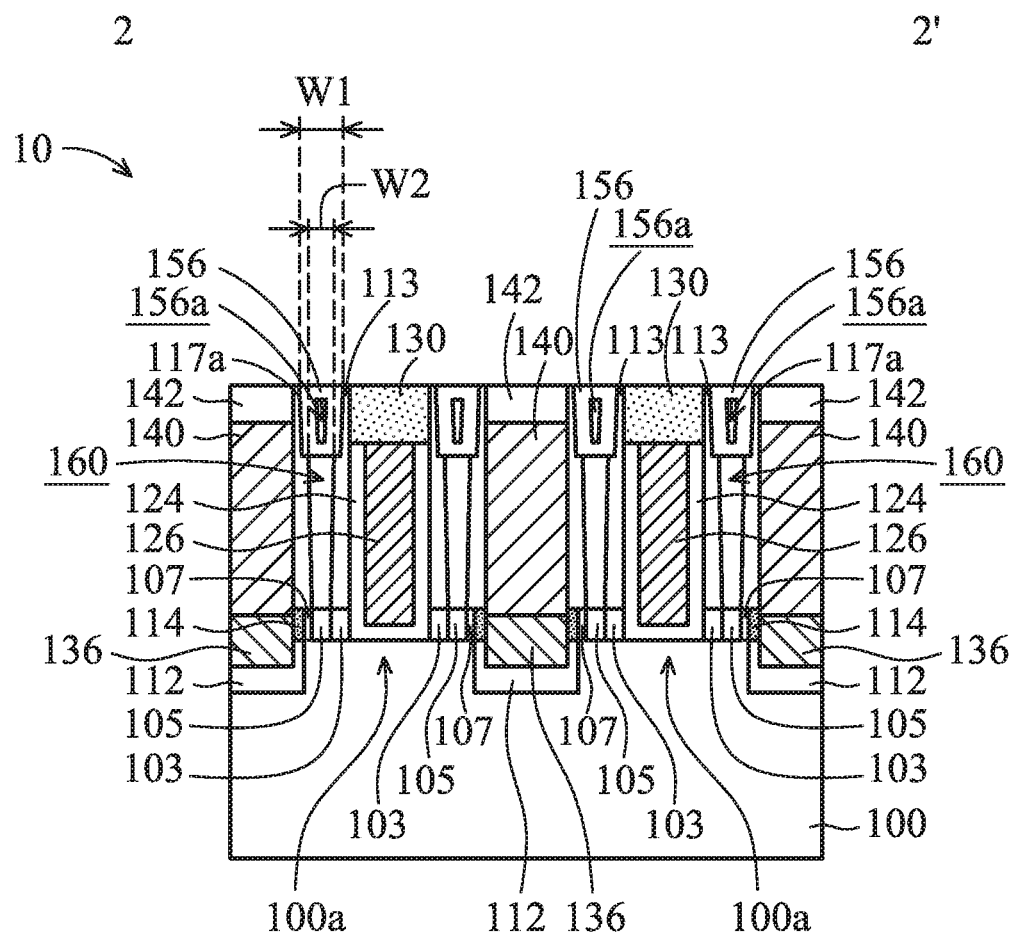

FIGS. 1A to 1F illustrate perspective views of various stages of manufacturing a semiconductor device structure 10 and FIGS. 2A to 2P illustrate cross-sectional representations of various stages of manufacturing a semiconductor device structure 10 in accordance with some embodiments. In addition, FIGS. 2A to 2F illustrate the cross-sectional representations of the semiconductor device structure 10 shown along line 2-2' in FIGS. 1A to 1F in accordance with some embodiments. In some embodiments, the semiconductor device structure 10 is implemented as a fin field effect transistor (FinFET) structure.

As shown in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. Generally, the SOI substrate is fabricated using a wafer bonding process, a silicon film transfer process, a separation by implantation of oxygen (SIMOX) process, another applicable method, or a combination thereof. In some embodiments, the substrate 100 is a silicon wafer. The substrate 100 may include silicon or another elementary semiconductor material such as germanium. In some other embodiments, the substrate 100 includes a compound semiconductor. The compound semiconductor may include gallium arsenide, silicon carbide, indium arsenide, indium phosphide, another suitable compound semiconductor, or a combination thereof.

Afterwards, multiple recesses (or trenches) are formed in the substrate 100 to successively form fin structures over the substrate 100, in accordance with some embodiments. As a result, multiple fin structures 100a are formed between the recesses. As shown in FIGS. 1A and 2A, one of the fin structures 100a is shown. In some embodiments, one or more photolithography and etching processes are used to form the fin structures 100a between the recesses.

Isolation features 104 are then formed in the recesses to surround lower portions of the fin structures 100a, as shown in FIGS. 1A and 2A in accordance with some embodiments. The isolation features 104 are used to define and electrically isolate various device elements formed in and/or over the substrate 100. In some embodiments, the isolation features 104 include shallow trench isolation (STI) features, local oxidation of silicon (LOCOS) features, other suitable isolation features, or a combination thereof. The insulating layer for the formation of the isolation features 104 may be made of silicon oxide, silicon nitride, silicon oxynitride, fluorosilicate glass (FSG), low-k dielectric materials, and/or another suitable dielectric material and may be deposited by a flowable chemical vapor deposition (FCVD) process, a chemical vapor deposition (CVD) process, an atomic layer deposition (ALD) process, or another applicable process.

Afterwards, dummy gate stacks 110a are formed across the fin structure 100a over the substrate 100 to cover the isolation features 104 by deposition, photolithography, and etching processes, as shown in FIGS. 1A and 2A in accordance with some embodiments. In such an etching process, a capping feature 101 is used as an etch mask. Each of the dummy gate stacks 110a includes an optional dummy gate dielectric layer (not shown) and a dummy gate electrode layer 106 formed over the dummy gate dielectric layer and capped by the capping feature 101. The dummy gate dielectric layer and the dummy gate electrode layer 106 may be made of silicon oxide and polysilicon, respectively.

Afterwards, multilayer gate spacers are formed on the opposite sidewalls of the dummy gate stacks 110a, respectively, as shown in FIGS. 1A and 2A in accordance with some embodiments. Each of the multilayer gate spacers includes a gate spacer layer 103 covering the sidewall of the corresponding dummy gate electrode layer 106, a gate spacer layer 105 covering the sidewall of the gate spacer layer 103, and a gate spacer layer 107 covering the sidewall of the gate spacer layer 105, as shown in FIGS. 1A and 2A in accordance with some embodiments. In some embodiments, the gate spacer layers 103, 105, and 107 have a top surface that is substantially level with the top surface of the capping feature 101.

In some embodiments, the gate spacer layers 103, 105, and 107 are made of different materials so that their etch selectivity is different. For example, the gate spacer layers 103, 105, or 107 may be made of SiO, SiN, SiC, SiCN, SiOC, SiON, SiCN, SiOCN, ZrO, HfO$_2$, AlO, AlON, or a high-k material or another applicable dielectric material. Moreover, the gate spacer layers 103, 105, and 107 may be formed by a deposition process, such as such as a chemical vapor deposition (CVD) process, a plasma enhanced CVD (PECVD) process, an atomic layer deposition (ALD) process, or another applicable deposition process. In some embodiments, the gate spacer layers 103, 105, and 107 have a width (which is also referred to as critical dimension (CD)) in a range from about 0.5 nm to about 10 nm.

After formation of the multilayer gate spacers, source/drain features 112 are formed in and laterally adjacent to the fin structure 100a, and exposed from the dummy gate stacks 110a, as shown in FIGS. 1A and 2A in accordance with some embodiments. In some embodiments, each multilayer gate spacer separates the corresponding dummy gate electrode layer 106 from the corresponding source/drain feature 112. In some embodiments, each of the source/drain features 112 (which are also referred to as source/drain regions) is formed by recessing the portions of the fin structure 100a laterally adjacent to the dummy gate stacks 110a and growing semiconductor materials in the formed recesses in the fin structure 100a by epitaxial (epi) growth processes. For example, the semiconductor device structure 10 may be an NMOS device, and the source/drain structure 112 may include Si, SiP, SiC, SiPC, or an III-V group semiconductor material (such as InP, GaAs, AlAs, InAs, InAlAs, or InGaAs), or the like. Alternatively, the semiconductor device structure 10 may be a PMOS device, and the source/drain feature 112 may include Si, SiGe, SiGeB, or an III-V group semiconductor material (such as InSb, GaSb, or InGaSb), or the like. The source/drain features 112 protrude above the isolation feature 104, as shown in FIG. 1A. For example, the source/drain features 112 have a height (which is also referred to as thickness) in a range from about 1 nm to about 30 nm.

In some embodiments, after the source/drain features 112 are formed, optional capping features 114 are formed to cover the source/drain features 112, respectively. The capping feature 114 may be made of Si, SiO, SiN, SiC, SiCN, SiOC, SiON, SiCN, SiOCN, ZrO, HfO$_2$, AlO, AlON, or a high-k material or another applicable dielectric material. Moreover, the capping features 114 may be formed by a deposition process, such as such as a chemical vapor deposition (CVD) process, a plasma enhanced CVD (PECVD) process, an atomic layer deposition (ALD) process, or another applicable deposition process. The formed capping features 114 may have a height (i.e., thickness) less than or equal to about 10 nm.

Afterward, the gate spacer layers 107 are recessed, as shown in FIGS. 1B and 2B in accordance with some embodiments. In some embodiments, the gate spacer layers 107 are recessed by an etching process (e.g., a dry etching process) using the capping features 114 as an etch stop layer. After the etching process, the remaining gate spacer layers 107 have a top surface that is substantially level with the uppermost surface of the capping features 101.

Afterward, the gate spacer layers 105 and the gate spacer layer 103 are successively or simultaneously recessed, as shown in FIGS. 1C and 2C in accordance with some embodiments. In some embodiments, the gate spacer layers 105 and the gate spacer layer 103 are recessed by one or more etching processes using the capping features 114 as an etch stop layer. After the gate spacer layers 105 and the gate spacer layer 103 are recessed, the sidewalls of each capping feature 101 and each dummy gate electrode layer 106 are exposed. The remaining gate spacer layer 105 and the remaining gate spacer layer 103 have a top surface that is substantially level with the top surface of the remaining gate spacer layer 107. Moreover, the remaining gate spacer layers 103, 105, and 107 form a first gate spacer structure that has a top surface below the top surface of the dummy gate electrode layer 106.

After the gate spacer layers 103, 105, and 107 are recessed, spacer layers 113 are formed to cover the exposed sidewalls of each capping feature 101 and each dummy gate electrode layer 106, respectively, as shown in FIGS. 1D and 2D in accordance with some embodiments. In some embodiments, the gate spacer layer 113 is formed directly over and in direct contact with the corresponding remaining gate spacer layer 103 and has a top surface that is substantially level with the top surface of the capping feature 101. The gate spacer layers 113 may be made of Si, SiO, SiN, SiC, SiCN, SiOC, SiON, SiCN, SiOCN, ZrO, $HfO_2$, AlO, AlON, or a high-k material or another applicable dielectric material. Moreover, the gate spacer layers 113 may be formed by a deposition process, such as such as a chemical vapor deposition (CVD) process, a plasma enhanced CVD (PECVD) process, an atomic layer deposition (ALD) process, or another applicable deposition process. In some embodiments, the gate spacer layers 113 have a width (i.e., CD) in a range from about 0.5 nm to about 10 nm and a thickness (i.e., height) in a range from about 1 nm to about 30 nm.

Afterward, spacer layers 115 are formed to cover the sidewalls of the gate spacer layer 113, respectively, as shown in FIGS. 1E and 2E in accordance with some embodiments. In some embodiments, the gate spacer layer 115 is formed directly over and in direct contact with the corresponding remaining gate spacer layer 105 and has a top surface that is substantially level with the top surface of the gate spacer layer 113.

In some embodiments, the gate spacer layers 115 are made of a material that is different from that of the gate spacer layer 113 so that they have a different etch selectivity. The gate spacer layers 115 may be made of Si, SiO, SiN, SiC, SiCN, SiOC, SiON, SiCN, SiOCN, ZrO, $HfO_2$, AlO, AlON, or a high-k material or another applicable dielectric material. Similarly, the gate spacer layers 115 may be formed by a deposition process that is the same or similar to the deposition process for forming the gate spacer layer 113. In some embodiments, the gate spacer layers 115 have a width (i.e., CD) in a range from about 0.5 nm to about 10 nm and a thickness (i.e., height) in a range from about 1 nm to about 30 nm.

After the gate spacer layer 115 is formed, an insulating liner layer 117 and an insulating layer 120 are successively formed over the substrate 100 to cover the isolation feature 104 and the capping features 114, as shown in FIGS. 1F and 2F in accordance with some embodiments. In some embodiments, the insulating liner layer 117 conformally covers the top surface of each capping feature 101, the sidewall of each gate spacer layer 115 and the top surface of each capping feature 114. Moreover, the insulating layer 120 covers the insulating liner layer 117. Afterwards, a polishing process, such as a chemical mechanical polishing (CMP) process, is performed to remove the excess insulating layer 120 and the excess insulating liner layer 117 above the capping feature 101a, as shown in FIGS. 1F and 2F in accordance with some embodiments. The remaining insulating liner layer 117 is formed for serving as a gate spacer layer 117a (indicated in FIG. 2J) after subsequent etching process. In other words, the remaining insulating liner layer 117, and the gate spacers 113 and 115 form a multilayer gate spacer. In some embodiments, the insulating liner layer 117 is made of a different material than the gate spacer layer 115 so that it may have a different etch selectivity. Alternatively, the insulating liner layer 117 may be made of the same material as the gate spacer layer 113. For example, the insulating liner layer 117 may be made of Si, SiO, SiN, SiC, SiCN, SiOC, SiON, SiCN, SiOCN, ZrO, $HfO_2$, AlO, AlON, or a high-k material or another applicable dielectric material. Similarly, the insulating liner layer 117 may be formed by a deposition process that is the same or similar to the deposition process used for forming the gate spacer layer 113 or 115. In some embodiments, the remaining insulating liner layer 117 has a width (i.e., CD) in a range from about 0.5 nm to about 10 nm and a top surface that is substantially level with the top surface of the gate spacer layer 115.

The remaining insulating layer 120 may serve as an interlayer dielectric (ILD) layer. In some embodiments, the insulating layer 120 is a single layer made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 120 is deposited using any suitable method, such as a chemical vapor deposition (CVD) process, a plasma enhanced CVD (PECVD) process, flowable CVD (FCVD) process, the like, or a combination thereof.

After the polishing process is performed, each of the dummy gate stacks 110a is replaced by an active gate stack, as shown in FIGS. 2G to 2I in accordance with some embodiments. In some embodiments, the capping features 101 and the underlying dummy gate stacks 110a are successively removed by etching, so as to form trench openings 122, as shown in FIG. 2G. Afterwards, the an active gate stack fills each of the trench openings 122, as shown in FIGS. 2H and 2I in accordance with some embodiments. Each of the active gate stacks includes a gate dielectric layer 124, a gate electrode layer 126, and a capping feature 130.

The gate dielectric layer 124 may be made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate electrode layer 126 is made of a conductive material, such as copper, tungsten, aluminum, titanium, tantalum, or another applicable material.

Each of the active gate stacks may further include a work functional metal layer (not shown) between the gate dielectric layer 124 and the gate electrode layer 126. The work function metal layer may be made of TiN, TaN, Ru, Mo, Al, WN, $ZrSi_2$, $MoSi_2$, $TaSi_2$, $NiSi_2$, WN, or a combination thereof. Alternatively, the work function metal layer may be made of Ti, Ag, TaAl, TaAlC, TiAlN, TaC, TaCN, TaSiN, Mn, Zr, or a combination thereof.

Afterwards, the gate dielectric layer 124 and the gate electrode layer 126 are recessed to form recessing openings (not shown), and each of the recessing openings is filled with the capping feature 130, as shown in FIG. 2I in accordance with some embodiments. For example, an insulating or semiconductor layer (not shown) is formed over the insulating layer 120 and fills the recessing openings. Afterwards, a polishing process, such as a chemical mechanical polishing (CMP) process, is performed to remove the excess insulating or semiconductor layer above the insulating layer 120. As a result, the remaining insulating or semiconductor layer forms the capping features 130 respectively in the recessing openings.

The capping feature 130 may be made of Si, SiO, SiN, SiC, SiCN, SiOC, SiON, SiCN, SiOCN, ZrO, $HfO_2$, AlO, AlON, or a high-k material or another applicable material.

The capping feature 130 may be formed by performing a chemical vapor deposition (CVD) process, a plasma enhanced CVD (PECVD) process, low-pressure CVD (LPCVD) process, an atomic layer deposition (ALD) process, or another applicable process.

The top surfaces of the capping features 130 are substantially level with the top surface of the insulating layer 120, as shown in FIG. 2I. The capping features 130 may serve as etch masks and protect the gate dielectric layer 124 and the gate electrode layer 126 from damage in the subsequent manufacturing processes (e.g., etching processes). In some embodiments, the capping features 130 have a thickness (i.e., height) in a range from about 1 nm to about 30 nm and a top surface that is substantially level with the top surface of the gate spacer layers 113 and 115, and the insulating liner layer 117.

After each of the recessed gate electrode layers 126 is capped with the capping feature 130, portions of the insulating layer 120, the insulating liner layer 117, and the capping feature 114 above each of the source/drain features 112 are removed, as shown in FIG. 2J in accordance with some embodiments. In some embodiments, the portions of the insulating layer 120, the insulating liner layer 117, and the capping feature 114 above each of the source/drain features 112 are successively removed by one or more etching processes, so as to form contact openings 132. Each of the contact openings 132 exposes a portion of the corresponding source/drain features 112. The remaining insulating liner layer 117 forms a gate spacer layer 117a adjacent to the corresponding gate spacer layer 115, so that the gate spacer layers 113, 115, and 117a form a multilayer gate spacer. Moreover, the remaining capping feature 114 may form a portion of the first gate spacer structure. In the contact opening 132, a conductive contact structure (which is also referred to as a source/drain contact structure) is formed therein in the subsequent manufacturing processes, so that the first gate spacer structure formed over the substrate 100 continuously extends from the sidewall of the corresponding active gate stack (e.g., the sidewall of the gate dielectric layer 124) to a sidewall of the corresponding conductive contact structure.

Afterwards, a deposition process is performed on the structure in FIG. 2J to form a conformal metal layer (not shown) over a sidewall and the bottom of each of the contact openings 132 in accordance with some embodiments. The conformal metal layer may be formed of Ti, Al, Zr, Hf, Ta, Co, Ni, Y, and may be formed by, for example, a CVD, ALD or electrochemical plating (ECP) process. Afterwards, an annealing process may be performed at a temperature of about 350° C. to about 500° C. While the annealing process is being performed, the conformal metal layer reacts with the exposed source/drain features 112, so as to form a metal silicide or germanide layer 136 on each of the exposed the source/drain features 112. The metal silicide or germanide layer 136 is employed to reduce the contact resistance between the source/drain features 112 and the subsequently formed conductive contact structure.

Afterwards, each of the remaining contact openings 132 is filled with a conductive contact structure 140 laterally adjacent to the corresponding active gate stack to serve as a source/drain contact structure, as shown in FIG. 2K in accordance with some embodiments. For example, a metal layer (not shown) is formed over the gate spacer layers 113, 115, and 117a and the capping features 130 and fills the remaining contact openings 132. Afterwards, a polishing process, such as a chemical mechanical polishing (CMP) process, is performed to remove the excess metal layer above the gate spacer layers 113, 115, and 117a and the capping features 130. As a result, the remaining metal layers form the conductive contact structures 140 respectively in the remaining contact openings 132, so as to electrically connect the corresponding source/drain features 112, respectively, via the corresponding metal silicide or germanide layer 136.

The conductive contact structure 140 may be made of W, Co, Ru, Ti, Ni, Cu, Au, Ag, Pt, Pd, Ir, Os, Rh, Al, Mo, or another applicable metal material. The conductive contact structure 140 may be formed by performing a chemical vapor deposition (CVD) process, a plasma enhanced CVD (PECVD) process, low-pressure CVD (LPCVD) process, an atomic layer deposition (ALD) process, or another applicable process. In some other embodiments, a metal barrier layer (not shown) is conformally formed on the bottom and sidewalls of each remaining contact openings 132 prior to the formation of the conductive contact structure 140. The metal barrier layer may be made of Ti, Ta, TiN, TaN, W, Co, Ru, or a combination thereof, or another applicable metal material. In some embodiments, the metal barrier layer has a thickness that is less than or substantially equal to 10 nm.

Afterwards, the metal barrier layer (if presented) and conductive contact structure 140 are recessed to form recessing openings (not shown), and each of the recessing openings is filled with an optional capping feature 142, as shown in FIG. 2L in accordance with some embodiments. In some embodiments, the method and the material used in the optional capping feature 142 is the same as or similar to those of the capping feature 130. For example, the optional capping feature 142 may be made of Si, SiO, SiN, SiC, SiCN, SiOC, SiON, SiCN, SiOCN, ZrO, HfO$_2$, AlO, AlON, or a high-k material or another applicable material. The top surfaces of the optional capping features 142 are substantially level with the top surfaces of the capping features 130 and the gate spacer layers 113, 115, and 170a. The optional capping feature 142 may serve as etch masks and protect the metal barrier layer (if presented) and conductive contact structure 140 from damage in the subsequent manufacturing processes (e.g., etching processes). In some embodiments, the capping features 130 has a thickness (i.e., height) less than or substantially equal to 30 nm.

After each of the recessed conductive contact structures 140 is capped with the capping feature 142, an opening 154 is formed in each of the multilayer gate spacer (which includes the gate spacer layers 113, 115, and 117a to expose a portion of the first gate spacer structure (which includes the remaining gate spacer layers 103, 105, and 107 and the remaining capping feature 114), as shown in FIGS. 2M to 2O in accordance with some embodiments. In some embodiments, the gate spacer layers 115 are recessed, so that openings 150 are formed above the recessed gate spacer layers 115, respectively, as shown in FIG. 2M. In some embodiments, the openings 150 are formed by removing the upper portion of the gate spacer layers 115 using an etching process (e.g., a dry etching process). The etching process is performed using a fluorine (F)-based gas, a chlorine (Cl)-based gas, or a combination thereof as a process gas. Moreover, the process temperature for etching is less than or substantially equal to about 200° C. In addition, the process pressure for etching is in a range from about 0.1 Torr to about 10 Torr.

Afterwards, openings 152 are formed above the recessed gate spacer layers 115, respectively, as shown in FIG. 2N in accordance with some embodiments. In some embodiments, the exposed sidewall of gate spacer layers 113 and 117a above the recessed gate spacer layers 115 and the top surface of the recessed gate spacer layers 115 are partially etched, so that openings 150 are widened to form openings 152 above the recessed gate spacer layers 115. In some embodiments, the openings 152 are formed using an etching process (e.g., a dry etching process). The etching process is performed using an F-based gas, a Cl-based gas, or a combination thereof as a process gas. Moreover, the process temperature for etching is less than or substantially equal to about 200° C. In addition, the process pressure for etching is in a range from about 0.1 Torr to about 10 Torr.

Afterwards, the remaining gate spacer elements 115 respectively under the openings 152 are entirely removed and the sidewalls of the openings 154 are partially removed to form the openings 154, as shown in FIG. 2O in accordance with some embodiments. In some embodiments, the opening 154 that exposes a portion of the first gate spacer structure are formed using an etching process (e.g., a dry etching process). The etching process is performed using an F-based gas, a Cl-based gas, or a combination thereof as a process gas. Moreover, the process temperature for etching is less than or substantially equal to about 200° C. In addition, the process pressure for etching is in a range from about 0.1 Torr to about 10 Torr. In some embodiments, the top width of the upper portion of the opening 154 is greater than the top width of the lower portion of the opening 154, so that the opening 154 has a T-shaped cross-sectional contour, as shown in FIG. 2O. Moreover, the upper portion of the opening 154 and the lower portion of the opening 154 may have tapered sidewalls.

After the openings 154 are formed, the upper portion of each of the openings 154 is capped with an insulating sealing layer 156 to form air gap 160, as shown in FIG. 2P in accordance with some embodiments. In some embodiments, the insulating sealing layer 156 is formed to separate the upper portion of the corresponding gate spacer layer 113 from the upper portion of the corresponding gate spacer layer 117a, so as to define the air gap 160 separating the lower portion of the corresponding gate spacer layer 113 from the lower portion of the corresponding gate spacer layer 117a. Namely, the air gap 160 is formed between the corresponding gate spacer layer 113 and the corresponding gate spacer layer 117a and between the insulating sealing layer 156 and the first gate spacer structure. The insulating sealing layer 156, the corresponding gate spacer layer 113 and 117a, and the corresponding air gap 160 form a second gate spacer structure. Therefore, the insulating sealing layer 156 may be referred to as a gate spacer layer and the air gap 160 may be referred to as an air spacer. The insulating sealing layer 156 may be made of Si, SiO, SiN, SiC, SiCN, SiOC, SiON, SiCN, SiOCN, ZrO, HfO$_2$, AlO, AlON, or a high-k material or another applicable dielectric material. Moreover, the insulating sealing layer 156 may be formed by a deposition process, such as such as a chemical vapor deposition (CVD) process, a plasma enhanced CVD (PECVD) process, an atomic layer deposition (ALD) process, or another applicable deposition process. In some embodiments, the insulating sealing layer 156 has a width (i.e., CD) in a range from about 0.5 nm to about 10 nm and a thickness (i.e., height) not less than about 1 nm and less than about 30 nm.

In some embodiments, the air gap 160 has a width (i.e., CD) in a range from about 0.5 nm to about 10 nm and a height in a range from about 1 nm to about 30 nm. In some embodiments, the first gate spacer structure and the second gate spacer structure are made of different materials and have different dielectric constant (k). In some embodiments, the first gate spacer structure has a dielectric constant (k) higher than that of the second gate spacer structure due to the existence of the air gap 160 in the second gate spacer structure.

Compared to a single type gate spacer structure between the active gate stack and the dielectric constant (k) structure 140, the dielectric constant of the first and second gate spacer structures can be adjusted by the selection of the materials thereof, thereby lowering the dielectric constant (k) of the first and second gate spacer structures. As a result, the parasitic capacitance between the gate electrode layer of the active gate stack and the corresponding conductive contact structure(s).

In some embodiments, the insulating sealing layer (or the gate spacer layer) 156 has a wider top width W1 than the top width W2 of the air gap 160, so that the air gap 160 is easier to form. In some embodiments, the insulating sealing layer 156 has a seam 156a formed therein, thereby lowering further the dielectric constant (k) of the second gate spacer structure.

Figure 3:
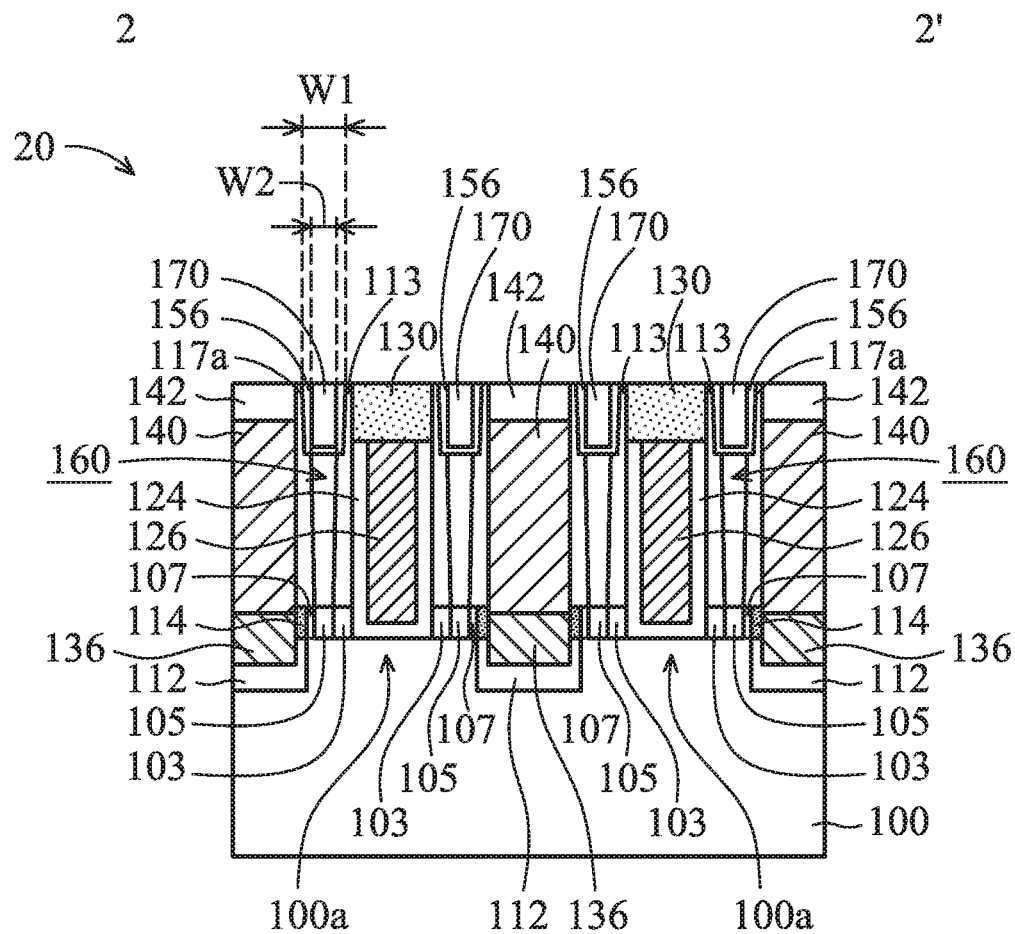
FIG. 3 illustrates a cross-sectional representation of a semiconductor device structure in accordance with some embodiments.

Many variations and/or modifications can be made to embodiments of the disclosure. FIG. 3 shows a cross-sectional representation of a semiconductor device structure 20, in accordance with some embodiments. The semiconductor device structure 20 shown in FIG. 3 is similar to the semiconductor device structure 10 shown in FIG. 2P. In some embodiments, the materials, formation methods, and/or benefits of the semiconductor device structure 10 shown in FIGS. 2A to 2P may also be applied in the embodiments illustrated in FIG. 3, and are therefore not repeated.

Unlike the single insulating sealing layer 156 in the semiconductor device structure 10 shown in FIG. 2P, the semiconductor device structure 20 includes multiple insulating layers to serves as a multilayer insulating sealing structure, in accordance with some embodiments. In some embodiments, the second gate spacer structure further includes another gate spacer layer (i.e., insulating sealing layer 170) formed in the insulating sealing layer 156. In some embodiments, the bottom and the sidewalls of the insulating sealing layer 170 are surrounded by the insulating sealing layer 156. In some embodiments, the insulating sealing layer 170 and the insulating sealing layer 156 are made of different materials. For example, the insulating sealing layer 170 is made of Si, SiO, SiN, SiC, SiCN, SiOC, SiON, SiCN, SiOCN, ZrO, HfO$_2$, AlO, AlON, or a high-k material or another applicable dielectric material. Moreover, the insulating sealing layer 170 may be formed by a deposition process, such as such as a chemical vapor deposition (CVD) process, a plasma enhanced CVD (PECVD) process, an atomic layer deposition (ALD) process, or another applicable deposition process. In some embodiments, the insulating sealing layer 170 has a width (i.e., CD) in a range from about 0.5 nm to about 10 nm and a thickness (i.e., height) less than that of the insulating sealing layer.

Figure 4:
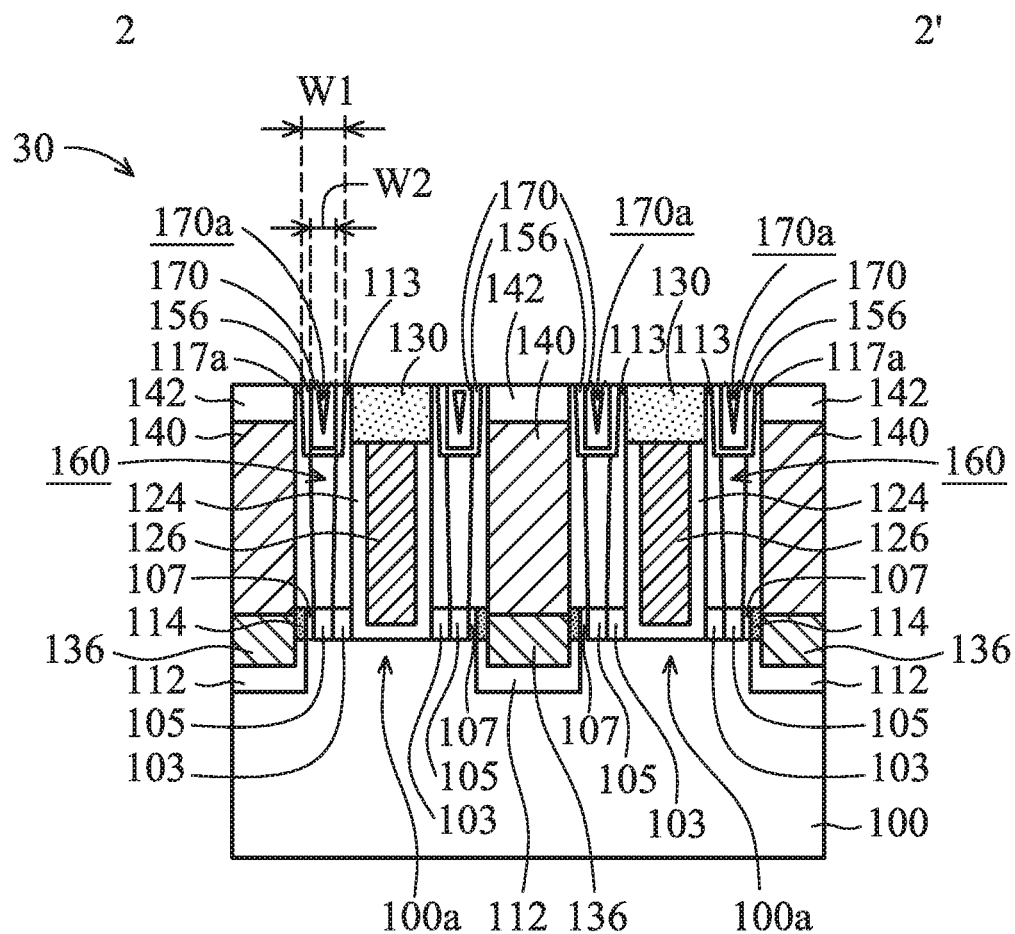
FIG. 4 illustrates a cross-sectional representation of a semiconductor device structure in accordance with some embodiments.

Many variations and/or modifications can be made to embodiments of the disclosure. FIG. 4 shows a cross-sectional representation of a semiconductor device structure 30, in accordance with some embodiments. The semiconductor device structure 30 shown in FIG. 4 is similar to the semiconductor device structure 20 shown in FIG. 3 and the semiconductor device structure 10 shown in FIG. 2P. In some embodiments, the materials, formation methods, and/or benefits of the semiconductor device structure 10 shown in FIGS. 2A to 2P may also be applied in the embodiments illustrated in FIG. 4, and are therefore not repeated.

Unlike the insulating sealing layer 170 in the semiconductor device structure 20 shown in FIG. 3 and similar to insulating sealing layer 156 in the semiconductor device structure 10 shown in FIG. 2P, the insulating sealing layer 170 in the semiconductor device structure 30 shown in FIG. 4 has a seam 170a formed therein, in accordance with some embodiments. The dielectric constant (k) of the second gate spacer structure can be lowered further via the seam 170a.

Figure 5:
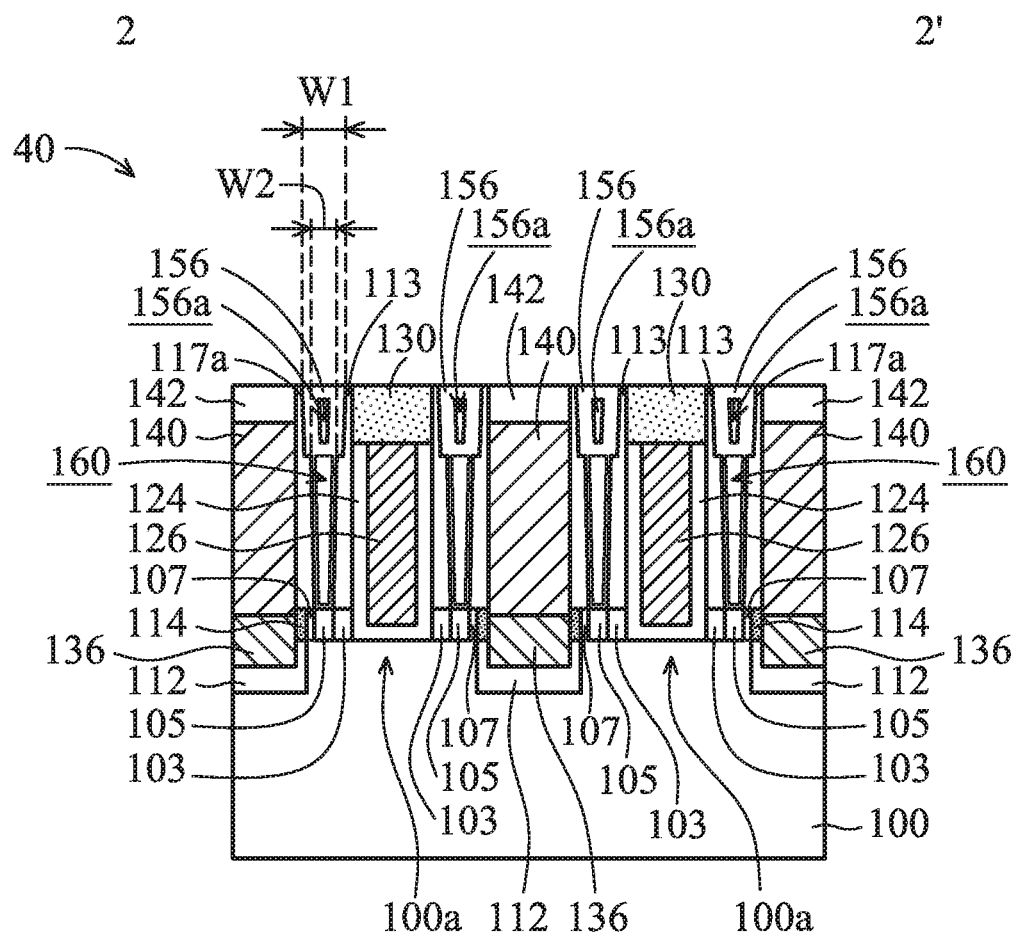
FIG. 5 illustrates a cross-sectional representation of a semiconductor device structure in accordance with some embodiments.

Many variations and/or modifications can be made to embodiments of the disclosure. FIG. 5 shows a cross-sectional representation of a semiconductor device structure 40, in accordance with some embodiments. The semiconductor device structure 40 shown in FIG. 5 is similar to the semiconductor device structure 10 shown in FIG. 2P. In some embodiments, the materials, formation methods, and/or benefits of the semiconductor device structure 10 shown in FIGS. 2A to 2P may also be applied in the embodiments illustrated in FIG. 5, and are therefore not repeated.

Unlike the semiconductor device structure 10 shown in FIG. 2P, the insulating sealing layer 156 in the semiconductor device structure 40 shown in FIG. 5 further extends in the corresponding air gap 160 to conformally cover the bottom and sidewalls of the air gap 160, in accordance with some embodiments. In those cases, the air gap 160 is entirely sealed by the insulating sealing layer 156 with a conformal liner portion. The conformal liner portion may have a thickness that is in a range from about 0.5 nm to about 5 nm.

Figure 6:
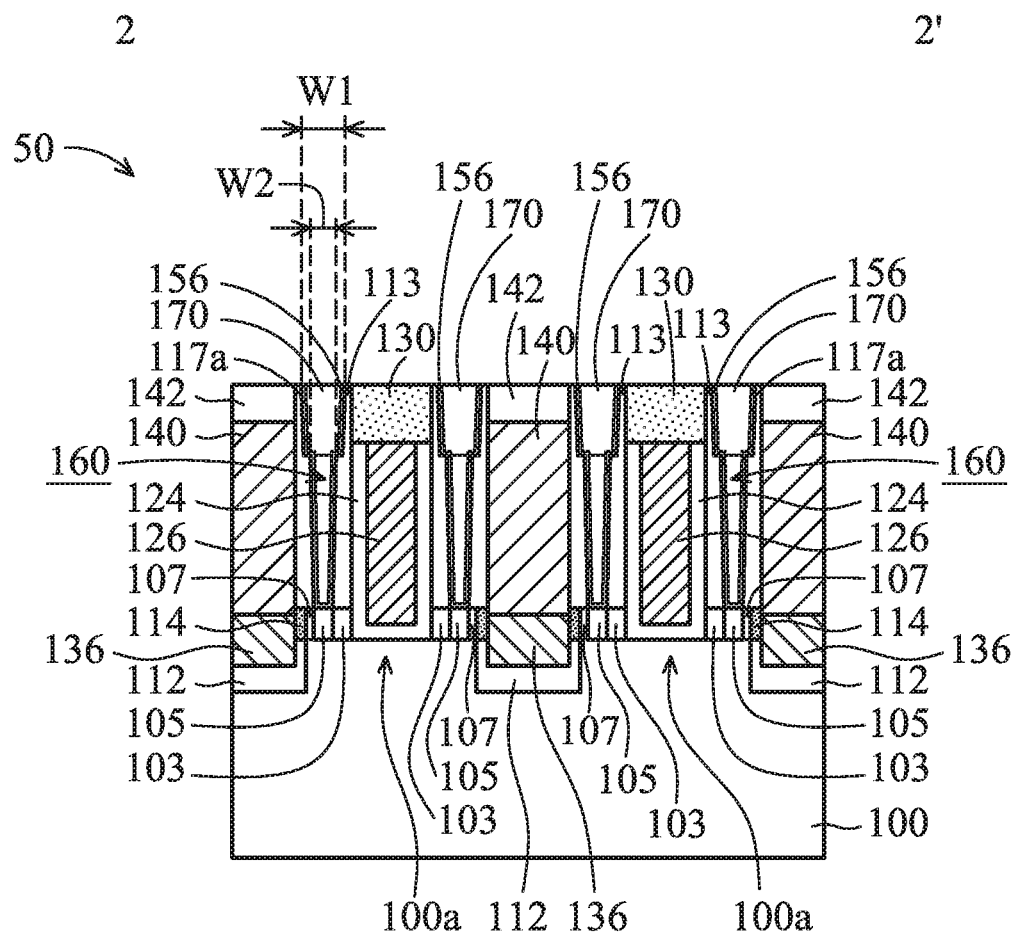
FIG. 6 illustrates a cross-sectional representation of a semiconductor device structure in accordance with some embodiments.

Many variations and/or modifications can be made to embodiments of the disclosure. FIG. 6 shows a cross-sectional representation of a semiconductor device structure 50, in accordance with some embodiments. The semiconductor device structure 50 shown in FIG. 5 is similar to the semiconductor device structure 20 shown in FIG. 3, the semiconductor device structure 40 shown in FIG. 5, and the semiconductor device structure 10 shown in FIG. 2P. In some embodiments, the materials, formation methods, and/or benefits of the semiconductor device structure 10 shown in FIGS. 2A to 2P may also be applied in the embodiments illustrated in FIG. 6, and are therefore not repeated.

Unlike the semiconductor device structure 20 shown in FIG. 3, the top of the air gap 160 in the semiconductor device structure 50 shown in FIG. 6 is capped by and in direct contact with the insulating sealing layer 170, in accordance with some embodiments. In addition, similar to insulating sealing layer 156 in the semiconductor device structure 40 shown in FIG. 5, the insulating sealing layer 156 in the semiconductor device structure 50 shown in FIG. 6 also extends in the corresponding air gap 160 to conformally cover the bottom and sidewalls of the air gap 160, in accordance with some embodiments. In those cases, the air gap 160 is entirely sealed by the insulating sealing layer 156 with a conformal liner portion.

Figure 7:
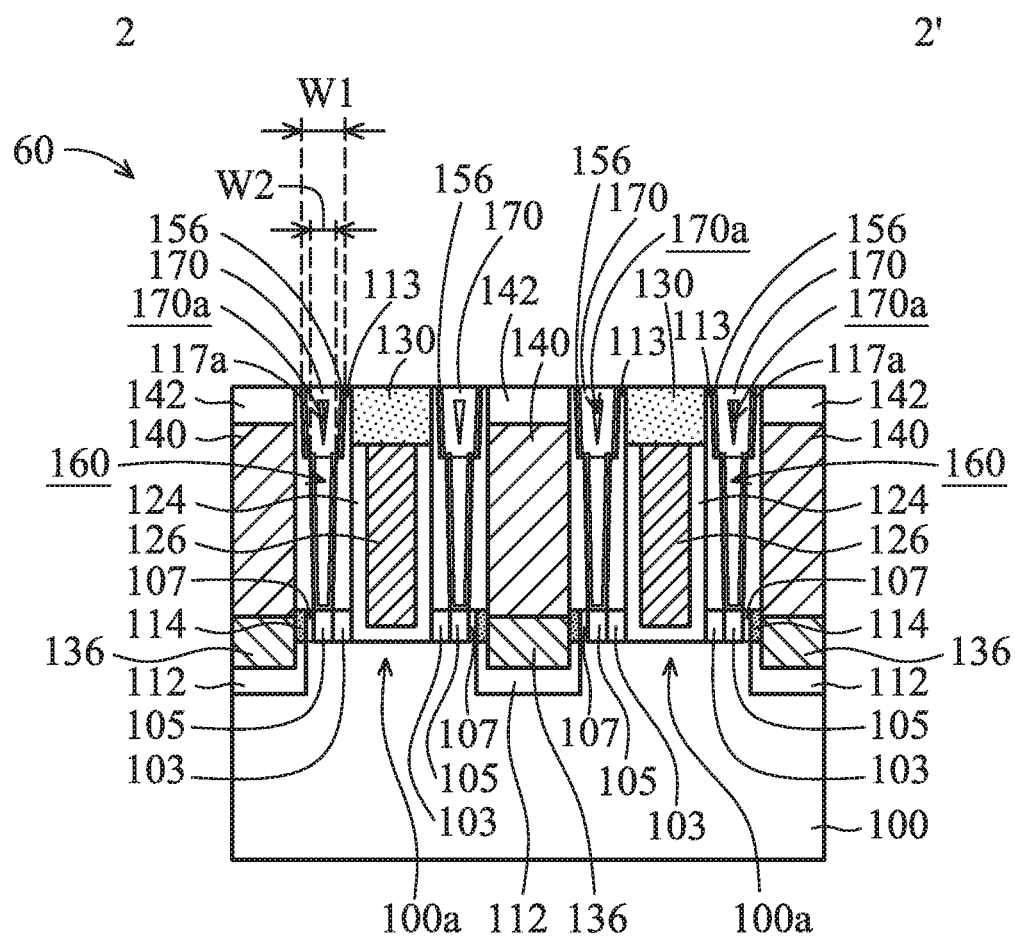
FIG. 7 illustrates a cross-sectional representation of a semiconductor device structure in accordance with some embodiments.

Many variations and/or modifications can be made to embodiments of the disclosure. FIG. 7 shows a cross-sectional representation of a semiconductor device structure 60, in accordance with some embodiments. The semiconductor device structure 60 shown in FIG. 7 is similar to the semiconductor device structure 50 shown in FIG. 6 and the semiconductor device structure 10 shown in FIG. 2P. In some embodiments, the materials, formation methods, and/or benefits of the semiconductor device structure 10 shown in FIGS. 2A to 2P may also be applied in the embodiments illustrated in FIG. 7, and are therefore not repeated.

Unlike the insulating sealing layer 170 in the semiconductor device structure 50 shown in FIG. 6, the insulating sealing layer 170 in the semiconductor device structure 60 shown in FIG. 7 has a seam 170a formed therein, in accordance with some embodiments. The dielectric constant (k) of the second gate spacer structure can be lowered further via the seam 170a.

Embodiments of methods for forming a semiconductor device structure are provided. The semiconductor device structure may include a gate stack and a source/drain contact structure over a fin structure of the semiconductor substrate. The formation of the semiconductor device structure includes forming a first gate spacer structure and a second gate spacer structure over the first gate spacer structure are successively formed between the gate stack and the source/drain contact structure. During the formation of the second gate spacer structure, a first gate spacer layer is formed adjacent to the sidewall of the gate stack, a second gate spacer layer is formed adjacent to the sidewall of the conductive contact structure, and a third gate spacer layer is formed to separate an upper portion of the first gate spacer layer from an upper portion of the second gate spacer layer, so as to define an air gap that separates a lower portion of the first gate spacer layer from a lower portion of the second gate spacer layer. As a result, the air gap reduces the dielectric constant (k) of the second gate spacer structure, thereby reducing the parasitic capacitance between the source/drain contact structure and the gate electrode layer of the gate stack. In addition, since the second gate spacer structure can be formed with a material that is different form a material of the first gate spacer structure, the total dielectric constant (k) of the first and second gate spacer structures can be lowered further. Therefore, the device performance can be effectively increased.

In some embodiments, a semiconductor device structure is provided. The semiconductor device structure includes a gate stack formed over a semiconductor substrate and a source/drain contact structure formed over the semiconductor substrate and laterally adjacent to the gate stack. The semiconductor device structure also includes a first gate spacer structure formed over the semiconductor substrate and continuously extending from a sidewall of the gate stack to a sidewall of the source/drain contact structure. In addition, the semiconductor device structure includes a second gate spacer structure formed over the first gate spacer structure and interposed between the sidewall of gate stack and the sidewall of the source/drain contact structure. The second gate spacer structure includes a first gate spacer layer adjacent to the sidewall of the gate stack, a second gate spacer layer adjacent to the sidewall of the source/drain contact structure, and a third gate spacer layer separating the first gate spacer layer from the second gate spacer layer. An air gap is formed between the first gate spacer layer and the second gate spacer layer and between the third gate spacer layer and the first gate spacer structure.

In some embodiments, a semiconductor device structure is provided. The semiconductor device structure includes a fin structure over a semiconductor substrate and a gate stack across the fin structure. The gate stack includes a gate electrode layer, a gate dielectric layer surrounding a bottom and sidewalls of the gate electrode layer, and a first capping feature covering the gate electrode layer and the gate dielectric layer. The semiconductor device structure also includes a source/drain feature adjacent to the fin structure and a conductive contact structure formed over and electrically connected to the source/drain feature. In addition, the semiconductor device structure includes a first gate spacer structure separating the gate dielectric layer from the source/drain feature, and a second gate spacer structure formed over the first gate spacer structure and interposed between a sidewall of gate stack and a sidewall of the conductive contact structure. The second gate spacer structure includes a first gate spacer layer adjacent to the sidewall of the gate stack, a second gate spacer layer adjacent to the sidewall of the conductive contact structure, and a third gate spacer layer separating an upper portion of the first gate spacer layer from an upper portion of the second gate spacer layer, so as to define an air gap separating a lower portion of the first gate spacer layer from a lower portion of the second gate spacer layer.

In some embodiments, a method for forming a semiconductor device structure is provided. The method includes forming a dummy gate electrode layer and a first multilayer gate spacer over a fin structure of a semiconductor substrate. The first multilayer gate spacer separates the dummy gate electrode layer from a source/drain feature over the semiconductor substrate. The method also includes recessing the first multilayer gate spacer, so as to form a first gate spacer structure that has a top surface below a top surface of the dummy gate electrode layer. The method also includes replacing the dummy gate electrode layer with an active gate electrode layer, and forming a second multilayer gate spacer over the first gate spacer structure and adjacent to the active gate electrode layer. In addition, the method includes forming a conductive contact structure over and electrically connected to the source/drain feature, and forming an opening in the second multilayer gate spacer to expose a portion of the first gate spacer structure. The method also includes capping an upper portion of the opening with an insulating sealing layer to form a second gate spacer structure over the first gate spacer structure. A lower portion of the opening defines an air gap in the second gate spacer structure. The second gate spacer structure includes the insulating sealing layer and the air gap. The first gate spacer structure has a dielectric constant different from a dielectric constant of the second gate spacer structure.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a gate stack formed over a semiconductor substrate;
a source/drain contact structure formed over the semiconductor substrate and laterally adjacent to the gate stack;
a first gate spacer structure formed over the semiconductor substrate and continuously extending from a sidewall of the gate stack to a sidewall of the source/drain contact structure; and
a second gate spacer structure formed over the first gate spacer structure and interposed between the sidewall of gate stack and the sidewall of the source/drain contact structure;
wherein the second gate spacer structure comprises:
a first gate spacer layer adjacent to the sidewall of the gate stack;
a second gate spacer layer adjacent to the sidewall of the source/drain contact structure; and
a third gate spacer layer separating the first gate spacer layer from the second gate spacer layer, wherein an air gap is formed between the first gate spacer layer and the second gate spacer layer and has a top below a top surface of the gate electrode layer in the gate stack.

2. The semiconductor device structure as claimed in claim 1, wherein the third gate spacer layer has a top width that is greater than a top width of the air gap.

3. The semiconductor device structure as claimed in claim 1, wherein the second gate spacer structure further comprises a fourth gate spacer layer formed in the third gate spacer layer.

4. The semiconductor device structure as claimed in claim 3, wherein the third gate spacer layer extends in the air gap to conformally cover a bottom and sidewalls of the air gap.

5. The semiconductor device structure as claimed in claim 3, wherein the fourth gate spacer layer has a seam formed therein.

6. The semiconductor device structure as claimed in claim 3, wherein a bottom and sidewalls of the fourth gate spacer layer are surrounded by the third gate spacer layer.

7. The semiconductor device structure as claimed in claim 1, wherein the third gate spacer layer extends in the air gap to conformally cover a bottom and sidewalls of the air gap.

8. The semiconductor device structure as claimed in claim 1, wherein the third gate spacer layer has a seam formed therein.

9. The semiconductor device structure as claimed in claim 1, wherein the first gate spacer structure has a dielectric constant that is different from a dielectric constant of the second gate spacer structure.

10. A semiconductor device structure, comprising:
a fin structure over a semiconductor substrate;
a gate stack across the fin structure, comprising:
a gate electrode layer;
a gate dielectric layer surrounding a bottom and sidewalls of the gate electrode layer; and
a first capping feature covering the gate electrode layer and the gate dielectric layer;
a source/drain feature adjacent to the fin structure;
a conductive contact structure formed over and electrically connected to the source/drain feature;
a first gate spacer structure separating the gate dielectric layer from the source/drain feature; and
a second gate spacer structure formed over the first gate spacer structure and interposed between a sidewall of gate stack and a sidewall of the conductive contact structure;
wherein the second gate spacer structure comprises:
a first gate spacer layer adjacent to the sidewall of the gate stack;
a second gate spacer layer adjacent to the sidewall of the conductive contact structure; and a third gate spacer layer separating an upper portion of the first gate spacer layer from an upper portion of the second gate spacer layer, so as to define an air gap separating a lower portion of the first gate spacer layer from a lower portion of the second gate spacer layer, wherein the first gate spacer structure has a dielectric constant that is higher than a dielectric constant of the second gate spacer structure.

11. The semiconductor device structure as claimed in claim 10, wherein the third gate spacer layer has a top width that is greater than a top width of the air gap.

12. The semiconductor device structure as claimed in claim 10, wherein the second gate spacer structure further comprises a fourth gate spacer layer formed in the third gate spacer layer.

13. The semiconductor device structure as claimed in claim 12, wherein the third gate spacer layer extends in the air gap to conformally cover a bottom and sidewalls of the air gap.

14. The semiconductor device structure as claimed in claim 10, wherein the third gate spacer layer extends in the air gap to conformally cover a bottom and sidewalls of the air gap.

15. The semiconductor device structure as claimed in claim 10, wherein a top surface of the third gate spacer is substantially level with a top surface of the first capping feature.

16. A semiconductor device structure, comprising:
a gate electrode layer formed over a fin structure over semiconductor substrate;
a gate dielectric layer comprising a first portion formed between the fin structure and the gate electrode layer and a second portion extending along a sidewall of the gate electrode layer and;
a first gate spacer structure formed over the fin structure and adjoining to the first portion of the gate dielectric layer; and
a second gate spacer structure extending from an upper surface of the first gate spacer structure, comprising:
a first gate spacer layer adjoining to and extending along the second portion of the gate dielectric layer;
a second gate spacer layer opposite and spaced apart from the first gate spacer layer; and
a third gate spacer layer adjoining between an upper portion of the first gate spacer layer and an upper portion of the second gate spacer layer, wherein top surfaces of the first, second, and third gate spacer layers are substantially level with each other.

17. The semiconductor device structure as claimed in claim 16, wherein the third gate spacer layer conformally extends along a sidewall of the first gate spacer layer and a sidewall of the second gate spacer layer to the upper surface of the first gate spacer structure.

18. The semiconductor device structure as claimed in claim 17, wherein the third gate spacer layer has a seam formed therein.

19. The semiconductor device structure as claimed in claim 16, wherein the second gate spacer structure further comprises a fourth gate spacer layer formed in the third gate spacer layer.

20. The semiconductor device structure as claimed in claim 19, wherein the third gate spacer layer conformally extends along a sidewall of the first gate spacer layer and a sidewall of the second gate spacer layer to the upper surface of the first gate spacer structure, and wherein the fourth gate spacer layer has a seam formed therein.

* * * * *